United States Patent
Yamamoto et al.

(10) Patent No.: US 10,068,543 B2
(45) Date of Patent: Sep. 4, 2018

(54) UNIT SHIFT REGISTER CIRCUIT, SHIFT REGISTER CIRCUIT, METHOD FOR CONTROLLING UNIT SHIFT REGISTER CIRCUIT, AND DISPLAY DEVICE

(71) Applicant: Sharp Kabushiki Kaisha, Osaka-shi, Osaka (JP)

(72) Inventors: Kaoru Yamamoto, Osaka (JP); Yasuyuki Ogawa, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 72 days.

(21) Appl. No.: 14/901,461

(22) PCT Filed: Feb. 25, 2014

(86) PCT No.: PCT/JP2014/054517
§ 371 (c)(1),
(2) Date: Dec. 28, 2015

(87) PCT Pub. No.: WO2014/208123
PCT Pub. Date: Dec. 31, 2014

(65) Prior Publication Data
US 2016/0372068 A1     Dec. 22, 2016

(30) Foreign Application Priority Data
Jun. 28, 2013 (JP) ................................. 2013-136485

(51) Int. Cl.
*G11C 19/00* (2006.01)
*G09G 3/36* (2006.01)
(Continued)

(52) U.S. Cl.
CPC ........... *G09G 3/3677* (2013.01); *G11C 19/28* (2013.01); *G02F 1/1368* (2013.01);
(Continued)

(58) Field of Classification Search
None
See application file for complete search history.

(56) References Cited

U.S. PATENT DOCUMENTS 4,623,908 A * 11/1986 Oshima ................. G02F 1/1368
257/66
8,218,713 B2 * 7/2012 Hsu ........................ G11C 19/28
377/64
(Continued)

FOREIGN PATENT DOCUMENTS

JP 2008-508654 A 3/2008
JP 2010-250303 A 11/2010
(Continued)

OTHER PUBLICATIONS

Official Communication issued in International Patent Application No. PCT/JP2014/054517, dated Jun. 10, 2014.

*Primary Examiner* — Tuan T Lam
(74) *Attorney, Agent, or Firm* — Keating & Bennett, LLP

(57) ABSTRACT

A unit shift register circuit constitutes each stage of a shift register circuit. The unit shift register circuit includes an output transistor (T1) configured to input a prescribed clock signal (CK) to a drain terminal, and output an output signal (OUT) from a source terminal. The unit shift register circuit includes a setting transistor (T2) in which a source terminal is connected to a gate electrode of the output transistor (T1), is configured to input an input signal (S) to the drain terminal, and is configured to input to a gate electrode an input signal (VS) in a case of charging a gate electrode (node (VC)) of the output transistor (T1). The input signal (VS) having a voltage higher than that of the input signal (S).

17 Claims, 17 Drawing Sheets

(51) Int. Cl.
  *G11C 19/28* (2006.01)
  *G02F 1/1343* (2006.01)
  *G02F 1/1362* (2006.01)
  *G02F 1/1368* (2006.01)

(52) U.S. Cl.
  CPC .. *G02F 1/134336* (2013.01); *G02F 1/136286* (2013.01); *G09G 2310/0251* (2013.01); *G09G 2310/0286* (2013.01); *G09G 2310/0291* (2013.01); *G09G 2310/08* (2013.01)

(56) References Cited

U.S. PATENT DOCUMENTS

| | | | | |
|---|---|---|---|---|
| 2005/0008114 | A1* | 1/2005 | Moon | G09G 3/3677 377/64 |
| 2007/0248205 | A1 | 10/2007 | Deane | |
| 2007/0296681 | A1* | 12/2007 | Kim | G11C 19/184 345/100 |
| 2008/0079682 | A1* | 4/2008 | Chang | G11C 19/287 345/98 |
| 2010/0245304 | A1 | 9/2010 | Umezaki | |
| 2010/0315403 | A1* | 12/2010 | Kaneyoshi | G09G 3/3614 345/211 |
| 2010/0325466 | A1* | 12/2010 | Ohta | G11C 19/28 713/400 |
| 2011/0001752 | A1* | 1/2011 | Ohta | G09G 3/3677 345/530 |
| 2011/0018845 | A1* | 1/2011 | Mizunaga | G09G 3/3677 345/204 |
| 2011/0058640 | A1* | 3/2011 | Shang | G11C 19/184 377/64 |
| 2011/0063014 | A1* | 3/2011 | Koyama | H03K 19/0013 327/427 |
| 2011/0075790 | A1 | 3/2011 | Hu | |
| 2011/0199365 | A1 | 8/2011 | Umezaki et al. | |
| 2012/0138922 | A1 | 6/2012 | Yamazaki et al. | |
| 2012/0153996 | A1* | 6/2012 | Su | G09G 3/3659 327/109 |
| 2012/0155604 | A1* | 6/2012 | Yang | G09G 3/3677 377/79 |
| 2012/0169703 | A1* | 7/2012 | Yang | G11C 19/184 345/212 |
| 2012/0327057 | A1* | 12/2012 | Sakamoto | G11C 19/28 345/211 |
| 2014/0086379 | A1* | 3/2014 | Ma | G11C 19/28 377/64 |

FOREIGN PATENT DOCUMENTS

| | | |
|---|---|---|
| JP | 2011-70761 A | 4/2011 |
| JP | 2011-191754 A | 9/2011 |
| JP | 2012-134475 A | 7/2012 |

* cited by examiner

PRE-CHARGE VOLTAGE REDUCED AFTER THRESHOLD DETERIORATION, AND IF T1 DOES NOT TURN ON, BOOSTING IS NOT DONE

OPERATION CONDITION: $Vck - Vt2 \geq Vt1$

UNIT SHIFT REGISTER CIRCUIT, SHIFT REGISTER CIRCUIT, METHOD FOR CONTROLLING UNIT SHIFT REGISTER CIRCUIT, AND DISPLAY DEVICE

TECHNICAL FIELD

The present invention relates to a unit shift register circuit, a shift register circuit, a method for controlling a unit shift register circuit, and a display device.

The subject application claims priority based on the patent application No. 2013-136485 filed in Japan on Jun. 28, 2013 and incorporates by reference herein the content thereof.

BACKGROUND ART

In mobile devices such as mobile telephones, display devices that use so-called monolithic technology, in which a drive circuit is formed on a glass substrate, simultaneously with the forming of pixel TFTs (thin-film transistors) have come into widespread use. In recent years, rather than circuits implemented by poly-Si TFTs, circuit implemented by TFTs that use a-Si (amorphous silicon) or oxide semiconductors such as indium gallium zinc oxide (an oxide semiconductor containing indium (In), gallium (Ga), zinc (Zn), and oxygen (O)) have begun being used.

It has been known that, in a drive circuit formed using the above-noted monolithic circuit technology, the threshold voltage of the TFTs might change due to aging or exhibit temperature dependency. In particular, there are cases in which a shift register circuit used in a scanning line drive circuit can have the following problem.

Specifically, in a shift register circuit, the gates of output TFTs used to drive the scanning lines operate with a voltage raised to a high voltage by bootstrapping, and diode-connected TFTs are used to pre-charge the gate electrodes and also so that there is no leakage at the time of boosting.

When using a diode-connected TFT, the pre-charge voltage is a value that is dropped by the amount of the threshold voltage of the TFT. Because a TFT that uses a-Si or an oxide semiconductor such as indium gallium zinc oxide exhibits a characteristic of variation in the threshold voltage because of the voltage stress applied to the gate electrode, the characteristics deteriorate with the passage of time, and the pre-charge voltage decreases commensurately. When the pre-charge voltage decreases, the voltage boosted by bootstrapping also decreases, the driving capacity of the output TFT decreases, and the output waveform becomes distorted. With further deterioration, the output voltage decreases and the shift register operation becomes unstable. This problem can be solved by, for example, using large TFTs that take into consideration the deterioration of characteristics. In this case, however, there is a problem of the surface area of the circuit increasing.

An example of a shift register circuit that seeks to solve such problems is described in Patent Document 1. Each stage of the shift register circuit shown in FIG. 2 of Patent Document 1 (which shall, along with the present invention, be referred to hereinafter as a unit shift register circuit) has a first input Rn−1 connected to the output of the previous stage, a drive transistor Tdrive that couples the first clock power line voltage Pn to the output of that stage, a compensation capacitor C1 for the purpose of compensating for the influence of the parasitic capacitance of the drive transistor, a first bootstrapping capacitor C2 connected between the gate of the drive transistor and the output of that stage, and an input transistor Tin1 (setting TFT), controlled by the first input Rn−1, for the purpose of charging the first bootstrapping capacitor C2. Additionally, each stage of the unit shift register circuit has an input section 10 having a second bootstrapping capacitor C3 connected between the gate of the input transistor Tin1 and the first input Rn−1 and which is coupled to the output Rn−2 of the stage two stages before.

In the unit shift register circuit described in Patent Document 1, by using two bootstrapping capacitors, the circuit is desensitized to the level and variations of the threshold voltage, enabling implementation using amorphous silicon technology.

CITATION LIST

Patent Document

[Patent Document 1] Publication Japanese Translation of PCT Application JP-T-2008-508654

DISCLOSURE OF THE INVENTION

Problems to be Solved by the Invention

However, with the unit shift register circuit described in Patent Document 1, it is necessary to provide a diode-connected input TFT and a second bootstrapping capacitor C3 as a voltage boosting circuit to raise the gate of the setting TFT for charging the first bootstrapping capacitor C2, thereby presenting a problem of an increase in the number of circuit elements.

The present invention, in consideration of the above-described situation, has as an object to provide a unit shift register circuit, a shift register circuit, a method for controlling a unit shift register circuit, and a display device capable of reducing the influence of characteristics deterioration, with a small number of circuit elements.

Means for Solving the Problems

A unit shift register circuit according to one aspect of the present invention to solve the above-described problem constitutes each stage of a shift register circuit, the unit shift register circuit including: an output transistor that includes a first gate electrode, a first source terminal, and a first drain terminal, is configured to input a prescribed clock signal to the first drain terminal, and is configured to output an output signal from the first source terminal; and a setting transistor that includes a second gate electrode, a second source terminal, and a second drain terminal, the second source terminal being connected to the first gate electrode of the output transistor in the setting transistor, is configured to input a first input signal to the second drain terminal, and is configured to input to the second gate electrode a second input signal in a case of charging the first gate electrode of the output transistor, the second input signal having a voltage higher than that of the first input signal.

In addition, in the unit shift register circuit according to another aspect of the present invention, in a case that the setting transistor charges the first gate electrode of the output transistor, the first input signal and the second input signal rise and, after charging of the first gate electrode, the second input signal voltage falls earlier than the fall of the first input signal voltage.

In addition, in the unit shift register circuit according to another aspect of the present invention, the output transistor is configured to boost the output signal by a bootstrapping operation that boosts the first gate voltage by a voltage charged in a parasitic capacitance between the first source terminal and the first gate electrode.

In addition, in the unit shift register circuit according to another aspect of the present invention, the first input signal is an output signal of the unit shift register circuit of another stage, and the second signal is a signal of the first gate electrode of an output transistor of the unit shift register circuit of another stage.

In addition, in the unit shift register circuit according to another aspect of the present invention, the clock signal is a multi-phase clock signal with overlapping, and clock signals having a plurality of different phases are supplied to a plurality of the unit shift register circuits.

In addition, in the unit shift register circuit according to another aspect of the present invention, the first gate electrode of the output transistor is configured to reset in response to an output signal of a subsequent stage of unit shift register circuit.

In addition, the unit shift register circuit according to another aspect of the present invention includes a reset circuit configured to reset the first gate electrode of the output transistor in response to the clock signal.

In addition, the unit shift register circuit according to another aspect of the present invention includes a pull-down circuit configured to pull down an output signal of the unit shift register circuit in response to the clock signal.

In addition, the unit shift register circuit according to another aspect of the present invention includes a pull-down circuit configured to pull down an output signal of the unit shift register circuit and the first gate electrode of the output transistor in response to a voltage of the first gate electrode.

In addition, the unit shift register circuit according to another aspect of the present invention includes a pull-down circuit configured to pull down an output signal of the unit shift register circuit and the first gate electrode of the output transistor in response to a prescribed clear signal.

In addition, the unit shift register circuit according to another aspect of the present invention includes a capacitive element configured to be connected between the first gate electrode and the first source terminal of the output transistor.

In addition, in the unit shift register circuit according to another aspect of the present invention, the setting transistor is constituted by a plurality of cascode-connected transistors.

In addition, in the unit shift register circuit according to another aspect of the present invention, at least the output transistor and the setting transistor include an oxide semiconductor in a semiconductor layer.

In addition, in the unit shift register circuit according to another aspect of the present invention, the oxide semiconductor is an oxide indium gallium zinc (an oxide semiconductor including an In—Ga—Zn—O based semiconductor, an oxide semiconductor containing indium (In), gallium (Ga), zinc (Zn), and oxygen (O)).

In addition, in the unit shift register circuit according to another aspect of the present invention, the oxide semiconductor has crystallinity.

In addition, a shift register circuit according to another aspect of the present invention is in a multistage connection of unit shift register circuits according to the above-described unit shift register circuit, wherein an output signal of the N−1 stage unit shift register circuit is the first input signal power of the N-stage unit shift register circuit, and the first gate electrode signal of an output transistor of the N−2 stage unit shift register circuit is the second input signal of the N-stage unit shift register circuit.

In addition, in the shift register circuit according to another aspect of the present invention, clock signals of a four-phase clock are input as clock signals to the unit shift register circuits sequentially, shifted by one-fourth period each.

In addition, a method for controlling a unit shift register circuit according to another aspect of the present invention is a method for controlling a unit shift register circuit that constitutes each stage of a shift register circuit, wherein the unit shift register circuit includes: an output transistor that includes a first gate electrode, a first source terminal, and a first drain terminal, is configured to input a prescribed clock signal to the first drain terminal, and is configured to output an output signal from the first source terminal; and a setting transistor that includes a second gate electrode, a second source terminal, and a second drain terminal, the second source terminal being connected to the first gate electrode of the output transistor in the setting transistor, is configured to input a first input signal to the second drain terminal, and is configured to input to the second gate electrode a second input signal differing from the first input signal; the method including: inputting to the setting transistor a second input signal in a case that the first gate electrode of the output transistor is charged, the second input signal having a voltage higher than that of the first input signal.

In addition, a display device according to another aspect of the present invention includes: a plurality of pixels; a plurality of scanning lines to which the plurality of pixels are connected; and a unit shift register circuit that constitutes each stage of a shift register circuit, wherein the unit shift register circuit including: an output transistor that includes a first gate electrode, a first source terminal, and a first drain terminal, is configured to input a prescribed clock signal to the first drain terminal, and is configured to output an output signal driving each of the scanning lines from the first source terminal; and a setting transistor that includes a second gate electrode, a second source terminal and a second drain terminal, the second source terminal being connected to the first gate electrode of the output transistor in the setting transistor, is configured to input a first input signal to the second drain terminal, and is configured to input to the second gate electrode a second input signal in a case of charging the first gate electrode of the output transistor, the second input signal having a voltage higher than that of the first input signal.

Effects of the Invention

According to one aspect of the present invention, by inputting different first and second input signals (where the first input signal voltage is smaller than the second input signal voltage) to the second source terminal and the second gate electrode of the setting transistor, it is possible to charge (that is, to pre-charge) the first gate electrode of the output transistor. In this case, it is easy to omit the diode-connected TFT and the second bootstrapping capacitor. Because it is possible to use, for example, the first gate electrode signal of the output transistor of another unit shift register circuit as the second input signal, it is easy to provide this. Thus, the unit shift register circuit of the present invention can easily reduce the influence of characteristics deterioration with a small number of circuit elements.

MODE FOR CARRYING OUT THE INVENTION

Figure 1:
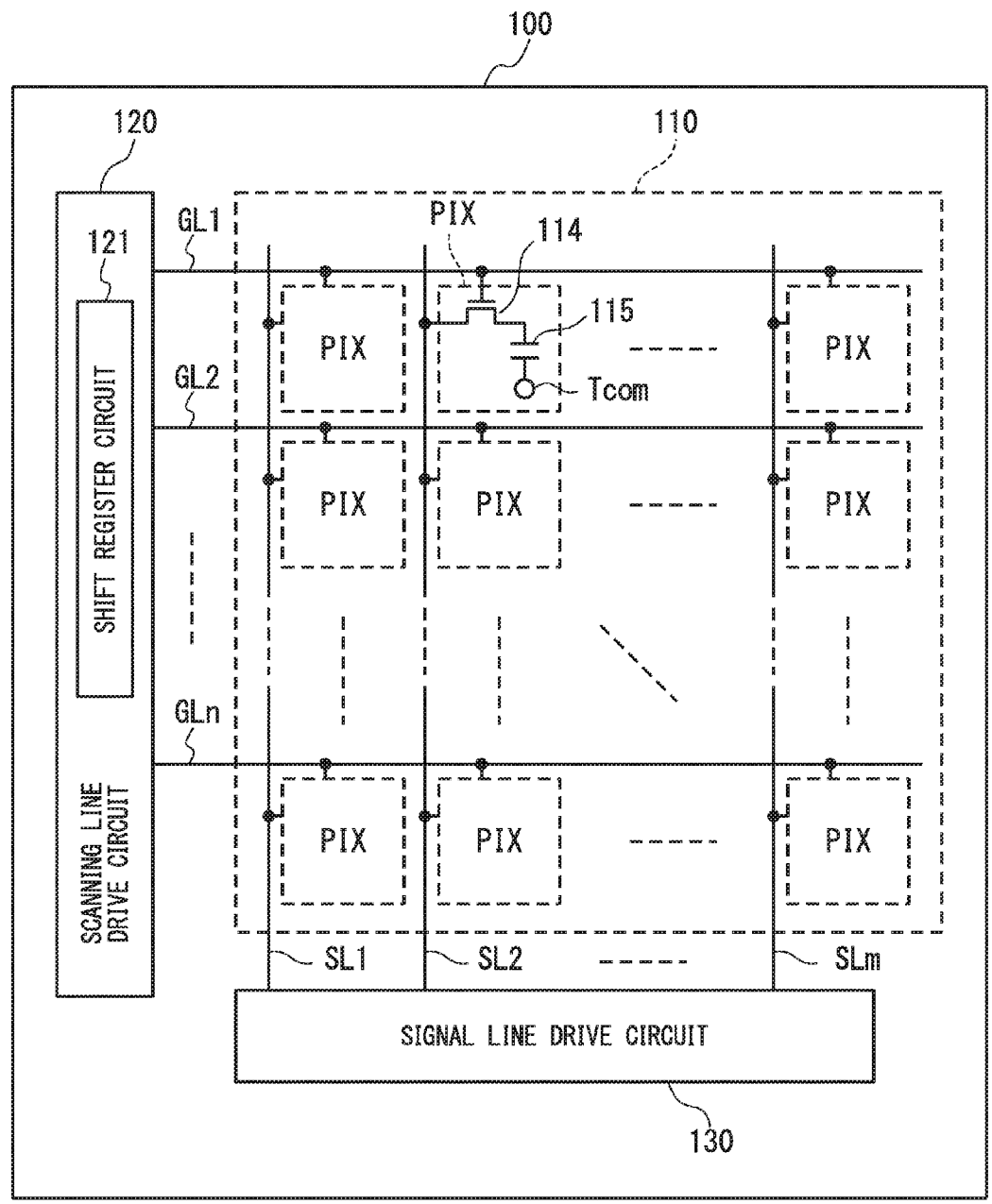
FIG. 1 is a conceptual drawing showing an example of the constitution of a liquid crystal display device of an embodiment of the present invention.

Embodiments of the present invention will be described below, with references made to the drawings.

First Embodiment

First, an example of the constitution of a liquid-crystal display device according to an embodiment of the present invention will be described, using FIG. 1. The active-matrix type liquid crystal display device 100 shown in FIG. 1 includes a plurality of signal lines SL1, SL2, . . . , SLm, a plurality of scanning lines GL1, GL2, . . . , GLn, and a plurality of pixel sections PIX provided so as to correspond to the points of intersection of the plurality of signal lines SL1, SL2, . . . , SLm and the plurality of scanning lines GL1, GL2, . . . , GLn (referred to collectively as GL). The pixel sections PIX are arranged in a matrix to constitute a display area 110. Each pixel section PIX includes, for example, a thin-film transistor (TFT) 114 that is a switching element, the gate of which is connected to a scanning line that passes through the corresponding point of intersection, and the source terminal of which is connected to a signal line that passes through the point of intersection, and a pixel capacitor 115, one end of which is connected to a common substrate Tcom, for holding a video signal. A signal line drive circuit 130 that drives the signal lines SL1, SL2, . . . , SLm and a scanning line drive circuit 120 that drives the scanning lines GL1, GL2, . . . , GLn are provided in the liquid crystal display device 100. The scanning line drive circuit 120 has a shift register circuit 121, and the shift register circuit 121 generates drive signals for each of the scanning lines GL1, GL2, . . . , GLn.

Next, referring to FIG. 2 and FIG. 3, an example of the constitution of the shift register circuit 121 shown in FIG. 1 will be described. FIG. 2 shows five unit shift register circuits 122 included in the shift register circuit 121 shown in FIG. 1 and the input and output signal lines thereof.

In the example of the constitution shown in FIG. 2, the shift register circuit 121 is constituted by a plurality of stages that are cascade connected (that is, in a multistage connection). The unit shift register circuits 122 that constitutes each stage has a clock terminal CK, a set terminal S, a terminal VS connected to the gate terminal of a setting transistor, an output terminal OUT, a terminal VC connected to a node VC, and a reset terminal R. In the description below, the names of signals input and output at each terminal will be taken as the terminal names and the names of nodes connected to each terminal will be in common with the terminal name. In FIG. 2, the signal lines GLn−3, GLn−2, GLn−1, GLn, GLn+1, GLn+2, GLn+3, and GLn+4 connected to an OUT terminal OUT or a reset terminal R correspond to seven scanning lines of the plurality of scanning lines GL shown in FIG. 1, which are arranged continuously. The indices such as n−3 and n indicate the stage number of the unit shift register circuit 122 that outputs that signal. In the example shown in FIG. 2, with the unit shift register circuit 122 in the center as the n stage, the upper two unit shift register circuits 122 are, in sequence from the top, the n−2 stage and the n−1 stage, and the lower two unit shift register circuits 122 are, in sequence from the top, the n+1 and the n+2 stage. With respect to the n stage, the n−2 and the n−1 stages will be referred to, respectively, as the second previous stage (or two stages previously) and the immediately previous stage. The n+1 stage and the n+2 stages will be referred to, respectively, as the immediately subsequent stage and the second subsequent stage. VCn−4, VCn−3, VCn−2, VCn−1, VCn, VCn+1, VCn+2, VCn+3, and VCn+4 are, respectively, the output signals of the terminal VC of the n−4, n−3, n−2, n−1, n, n+1, n+2, n+3, and n+4 unit shift register circuits 122.

At the Nth unit shift register circuit 122 stage, the output GLn−1 of the immediately previous stage is input as the S signal, which is the input signal at the terminal S of the Nth stage, the output VCn−2 of the second previous stage is input as the VS signal, which is the input signal at the terminal VS of the Nth stage, and the output GLn+2 of the second subsequent stage is input as the R signal, which is the input signal at the terminal R of the Nth stage. The clock signals CK input to the terminal CK form a four-phase clock, this being connected in the sequence of CK1, CK2, CK3, CK4, CK1, CK2, and so on, in groups of four stages of the unit shift register circuits 122.

Figure 3:
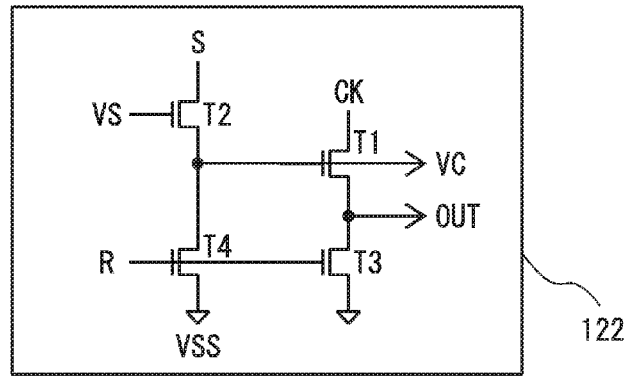
FIG. 3 is a block diagram showing an example according to the constitution (first embodiment) of a unit shift register circuit of the present invention.

As shown in FIG. 3, each the unit shift register circuit 122 is constituted by a TFT T1 (hereinafter referred to as transistor T1 or simply T1, this applying to other TFTs as well) and T3, which are connected to GL (OUT), which drives a scanning line, and transistors T2 and T4, which are connected to node VC, which is the gate electrode of T1. The signal VS and the signal S are connected, respectively to the gate terminal and the drain terminal of T2. Transistors T1 to T4 are n-channel TFTs (thin-film transistors).

T1 is an output transistor for outputting a pulse signal to the output terminal OUT, the drain of which is connected to the clock terminal CK, the gate of which is connected to the node VC and the source of which is connected to the output terminal OUT. T1 operates so as to boost the voltage at the output terminal OUT by bootstrapping that boosts the gate voltage by the voltage charged in the parasitic capacitance, which is not illustrated in FIG. 3, between the source terminal and the gate terminal.

T2 has its gate connected to the VS terminal, its drain connected to the set terminal S, and its source connected to the node VC. At the time of pre-charging, a voltage that is higher than the input signal at the set terminal S (for example, a voltage high enough to establish a threshold voltage even with deterioration of T2) is input to the VS terminal, and the input voltage at the set terminal S can be supplied as is to the node VC.

T3 has its gate, drain, and source connected, respectively, to the R terminal, the output terminal OUT, and a VSS terminal (that is, to the power supply voltage VSS). T4 has its gate, drain, and source connected, respectively, to the R terminal, the node VC, and the VSS terminal. The power supply voltage VSS is a voltage taken as a reference in operation of the unit shift register circuit 122.

The relationship between the constitution shown in FIG. 3 and the constitution of the present invention as recited in the claims is as follows. The transistor T1 is one example of the constitution of the "output transistor." The transistor T2 is one example of the constitution of the "setting transistor." The signal S input to the set terminal S corresponds to the "first input signal," and the signal VS input to the terminal VS corresponds to the "second input signal."

Figure 4:
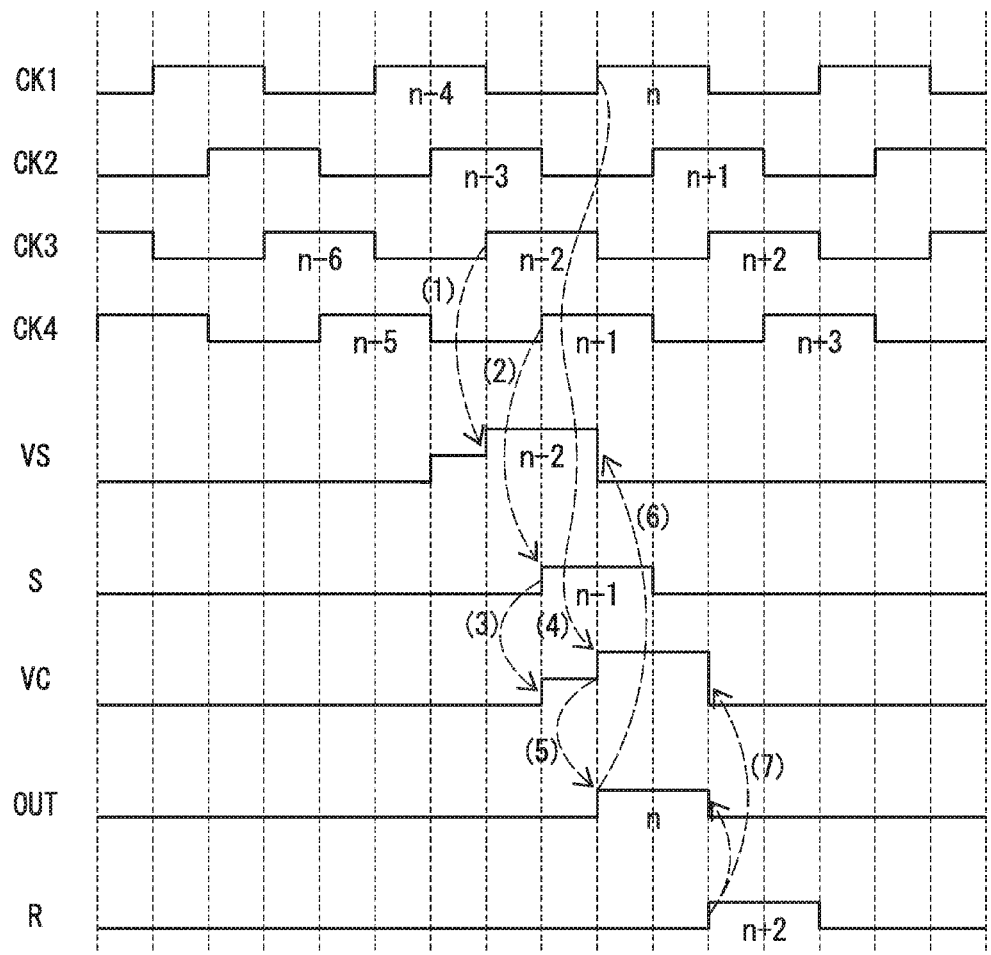
FIG. 4 is an operational timing diagram of the unit shift register circuit 122 (first embodiment) shown in FIG. 3.

Next, referring to FIG. 4, an example of the operation of the unit shift register circuit 122 shown in FIG. 3 will be described. FIG. 4 is a timing diagram showing an example of the operation of the n stage unit shift register circuit 122. The four clock phases CK1 to CK4 are successively shifted by one-quarter period and input in sequence to the unit shift register circuits 122 stages, so as to drive the unit shift register circuits 122. In FIG. 4, the numbers n−6 to n+3 of the clock signals CK1 to CK4 indicate the number of the unit shift register circuit 122 stage that the corresponding pulse is acting on as a clock signal. That is, they indicate the number of stage of unit shift register circuit 122 that is selected by the clock signal CK for output of the output signal OUT.

The drive of the unit N (=n) shift register circuit 122 stage is done as follows.

In FIG. 4, at the timing indicated by (1) and the arrow of the associated dashed line, the second previous stage unit shift register circuit 122 operates, and the (voltage at) node VCn−2 that was boosted is input to the VS terminal.

Next, in FIG. 4, at the timing indicated by (2), the previous stage unit shift register circuit 122 operates, and the GLn−1 output node is input to the S terminal.

In this case, at the timing indicated by (3) in FIG. 4, VS is at the boosted voltage, and the input signal from S is charged as is to node VC.

Next, in FIG. 4 at the timing indicated by (4), with the gate electrode of T1 in the charged state, when the CK1 pulse is input, bootstrapping operation causes node VC to be boosted to a high potential.

In this case, at the timing indicated by (5) in FIG. 4, because node VC is boosted to a sufficiently high voltage, the CK pulse is output to the OUT terminal, that is, to GLn.

Simultaneously, at the timing indicated by (6) in FIG. 4, the output OUT is input to the R terminal of the second previous stage, and node VC of the unit shift register circuit 122 two stages previously is pulled down.

Additionally, at the timing indicated by (7) in FIG. 4, the N+2 stage output GLn+2 is input to the R terminal, and node VC and node OUT are pulled down to VSS.

In the above-noted operation, when the setting transistor T2 charges the gate electrode of the output transistor T1, the input signal S and the input signal VS rise and, after charging of the gate electrode of transistor T1, the input signal VS voltage falls earlier than the fall of the input signal S voltage. For this reason, even if a diode connection is not inserted, it is possible to prevent a drop in the voltage on the charged gate electrode, without the occurrence of reverse flow to other stages.

Figure 5A:
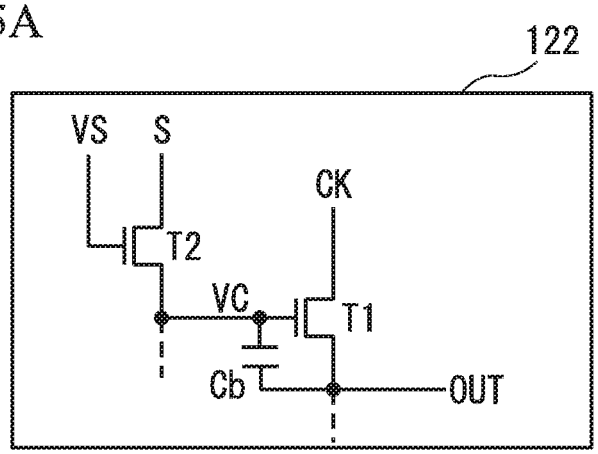
FIG. 5A is a first drawing describing the effect of the unit shift register circuit 122 (first embodiment) of the present invention.
Figure 5B:
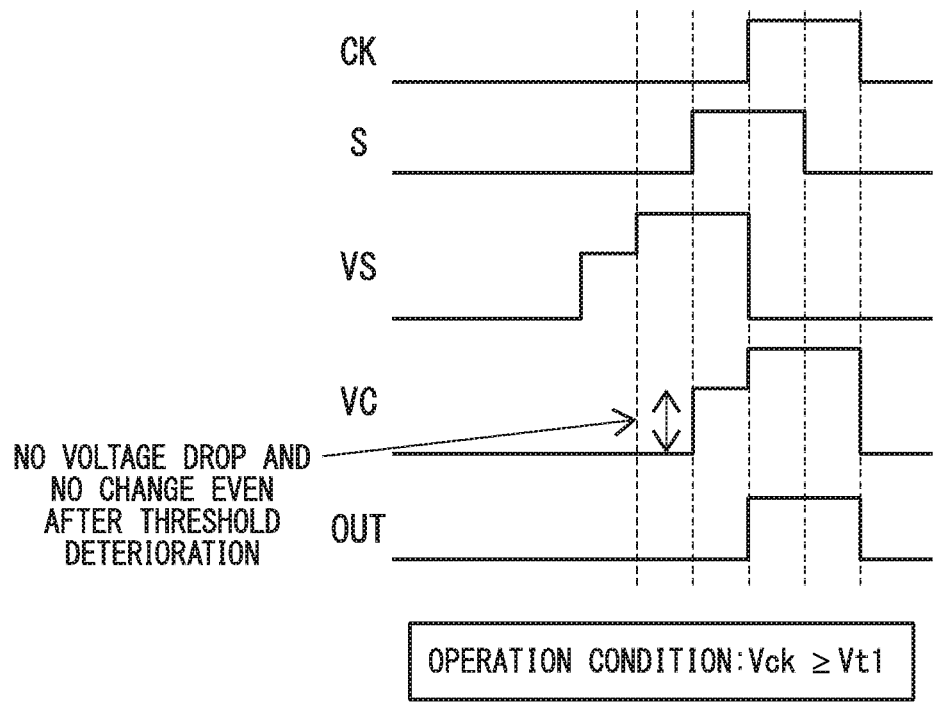
FIG. 5B is a second drawing describing the effect of the unit shift register circuit 122 (first embodiment) of the present invention.
Figure 5C:
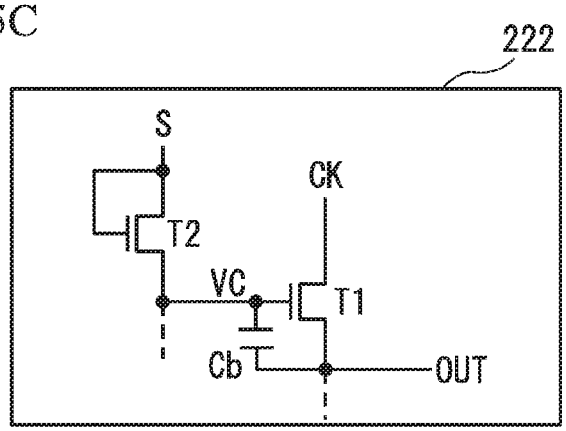
FIG. 5C is a third drawing describing the effect of the unit shift register circuit 122 (first embodiment) of the present invention.
Figure 5D:
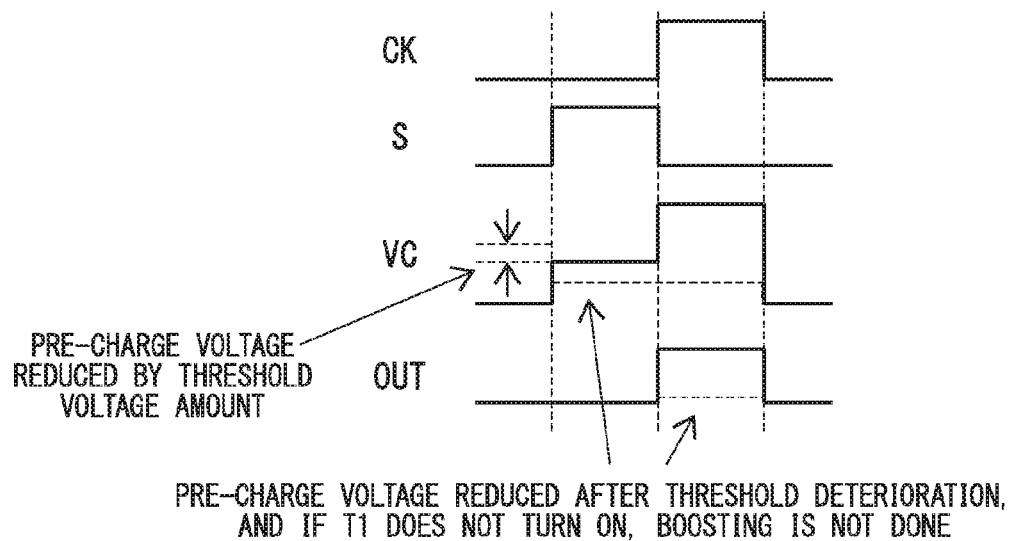
FIG. 5D is a fourth drawing describing the effect of the unit shift register circuit 122 (first embodiment) of the present invention.

Next, referring to FIG. 5A to FIG. 5D and FIG. 6, the effect of the first embodiment will be described. FIG. 5A to FIG. 5D and FIG. 6 are descriptive drawings for describing a comparison of the constitution and the operating effect between the present embodiment and the diode-connection scheme (for example, a scheme equivalent to what was described as conventional art regarding Patent Document 1). FIG. 5A shows the constitution of the unit shift register circuit 122 according to the present embodiment, which clearly shows the boosting capacitor Cb, which is a parasitic capacitance. In FIG. 5A, elements that are the same as those shown in FIG. 3 have been assigned the same reference symbols. FIG. 5B is a timing diagram showing an example of the operation of the constitution shown in FIG. 5A. Although FIG. 5B is the same as the timing diagram of FIG. 4, it is presented again in order to make a comparison with the diode-connection scheme. FIG. 5C shows an example of the constitution of a unit shift register circuit 222 using a diode-connection scheme. In this case, the drain and gate of T2 are connected to the terminal S. FIG. 5D is a timing diagram showing an example of the operation of the constitution shown in FIG. 5C.

As shown in FIG. 5C and FIG. 5D, with the diode-connected scheme, the voltage that is pre-charged to VC drops by the amount of the threshold value of T2, and because the dropped voltage establishes whether or not T1 will be turned on and bootstrapping will be applied, the influence by the shift of the thresholds of both T1 and T2 occurs. In this case, if the clock amplitude is Vck, and the threshold voltages of T1 and T2 are Vt1 and Vt2, the operation condition is Vck−Vt2≥Vt1.

In contrast, as shown in FIG. 5A and FIG. 5B, in the present embodiment, because there is no voltage drop by the amount of the threshold voltage by T2, the only influence is by the threshold of T1, and the operation condition is Vck≥Vt1.

Figure 6:
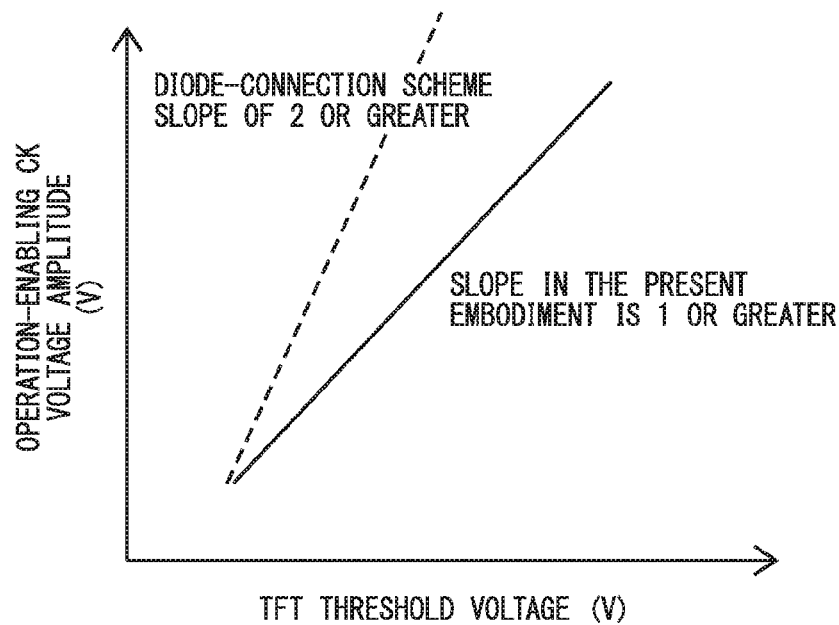
FIG. 6 is another describing the effect of the unit shift register circuit 122 (first embodiment) of the present invention.

FIG. 6 is a drawing showing the characteristics of the relationship between the TFT threshold voltage and the voltage amplitude of the operation-enabling clock CK.

In FIG. 6, the horizontal axis indicates the TFT threshold voltage, and the vertical axis indicates the voltage amplitude of the operation-enabling clock (lower limit value of the CK voltage amplitude). The relationship between the TFT threshold voltage and the lower limit value of the CK voltage amplitude can be approximated by a line segment.

In the diode-connection scheme, because the above-described operation condition is expressed using the threshold voltages of T1 and T2, the lower limit value of the CK voltage amplitude enabling operation has a slope of 2 or greater with respect to the TFT threshold voltage. In contrast, with the present embodiment, because the above-described operation condition is expressed using the threshold voltage of T1, the lower limit value of the CK voltage amplitude enabling operation is reduced to a slope of 1 with respect to the TFT threshold voltage.

Therefore, from the drawing of the characteristics shown in FIG. 6, it can be seen that, when the TFT threshold voltage shifts, the lower limit value of the CK voltage amplitude in the present embodiment does not change greatly compared with the lower limit value of the CK voltage amplitude in the diode-connection scheme. That is, with the present embodiment, there is an improvement in the operating margin with respect to threshold voltage shift compared with the diode-connection scheme.

However, the above comparison is a comparison of theoretical limit values and assumes that TFTs of the present embodiment and the diode-connected scheme have sufficient driving capacity. That is, failure to operate because of insufficient capacity is not considered.

Figure 7:
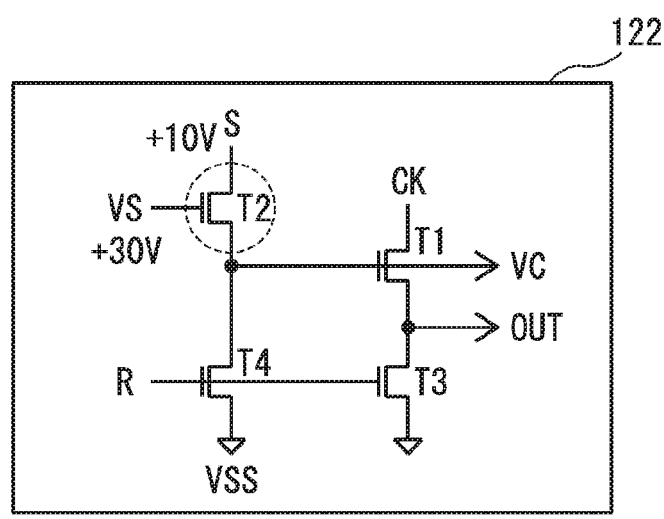
FIG. 7 is drawing describing an example of the operation of the unit shift register circuit 122 (first embodiment) shown in FIG. 3.
Figure 8:
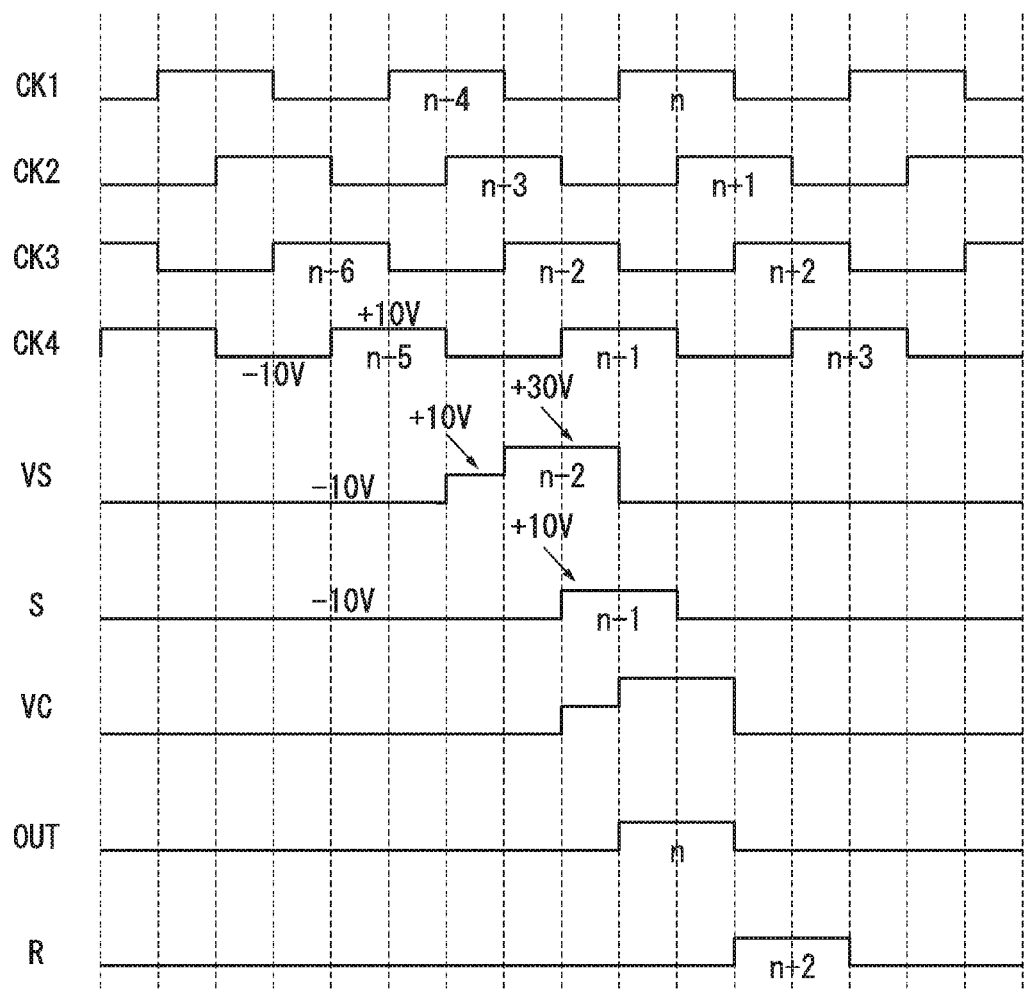
FIG. 8 is the operational timing diagram of the unit shift register circuit 122 shown in FIG. 4, with voltage values added.

Next, referring to FIG. 7 and FIG. 8, an example of the operating voltage of the unit shift register circuit 122 of the first embodiment will be described. FIG. 7 is the block diagram shown in FIG. 3 with voltage values added. FIG. 8 it the operational timing diagram of the unit shift register circuit 122 shown in FIG. 4, with voltage values added.

The case of a CK high-level potential of +10 V, a CK low-level potential of −10 V, VSS of −10 V, and an initial TFT threshold of 3 V is shown. In this case, in the bootstrapping operation, the node VC voltage is pushed upward by the amount of the CK amplitude by the bootstrapping (the boosting rate in this case being made 100%). That is, VC is boosted from 10 V to 30 V. Thus, in the unit shift register circuit 122 in the subsequent stage, to which that VC is input, at the time of the setting operation (when the signal S is input to the terminal S), because 30 V is input to the gate and 10 V is input to the terminal S, T2 operates in a linear region, and the node VC is pre-charged to 10 V, without the influence from the T2 threshold.

It is when T2 is in the saturated region that the pre-charge voltage is affected by the threshold. Therefore, for example, when Vgs=40 V and Vds=20 V, because the current Vth is 3 V, there is a margin of approximately 17 V. In this case, Vgs is the gate-source voltage and Vds is the drain-source voltage of T2.

Second Embodiment

Figure 9:
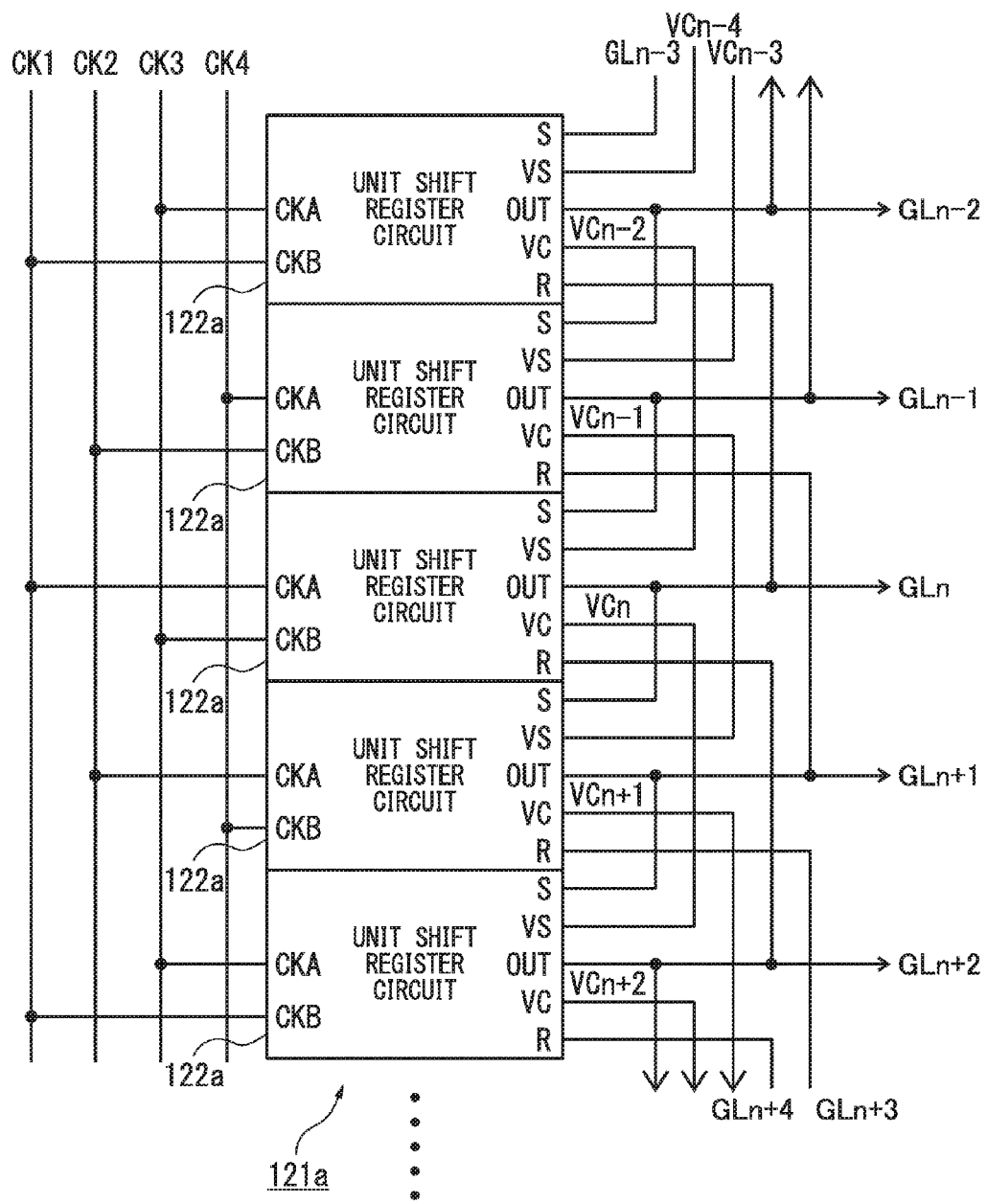
FIG. 9 is a block diagram showing an example of the constitution (second embodiment) of a shift register circuit according to the present invention.

Next, referring to FIG. 9 to FIG. 11, the second embodiment of the present invention will be described. As shown in FIG. 9, the shift register circuit 121a of the second embodiment differs from the shift register circuit 121 of the first embodiment shown in FIG. 2 with regard to the constitution of the clock signals CK. In the present embodiment two types of clock signals, CKA and CKB, are input to the shift register circuit 121a. Also, the shift register circuit 121a has a constitution corresponding to the shift register circuit 121 shown in FIG. 1 within the liquid crystal display device 100 shown in FIG. 1, and the circuitry peripheral to the scanning line GL is the same as the case of the shift register circuit 121. Also, the same reference symbols and names have been applied to signals and terminals throughout each embodiment.

As shown in FIG. 9, the shift register circuit 121a of the second embodiment is constituted by a plurality of stages of cascade-connected unit shift register circuits 122a. The N-stage S signal inputs the output GLn−1 of the immediately previous stage, the N-stage VS signal inputs the output VCn−2 of the second previous stage, and the N-stage R signal inputs the output GLn+2 of the second subsequent stage.

The clock signals CK constitute a four-phase clock, which is connected in the sequence of CKA=CK1 and CKB=CK3, CKA=CK2 and CKB=CK4, CKA=CK3 and CKB=CK1, and CKA=CK4 and CKB=CK2, in groups of four stages of the unit shift register circuit 122a. In this case, the clock signals CKA and CKB are in mutually inverted phases.

Figure 10:
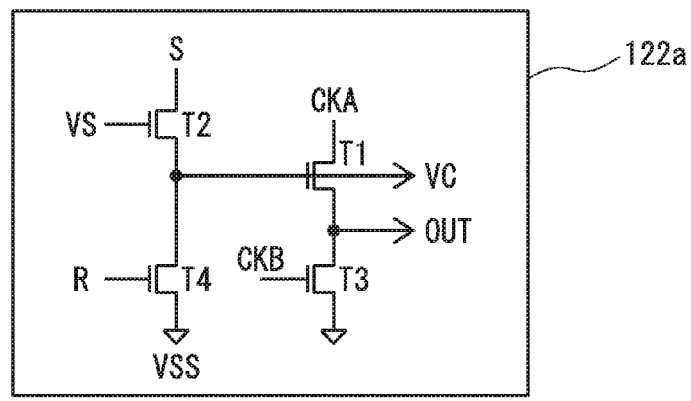
FIG. 10 is a block diagram showing an example of the constitution (second embodiment) of a unit shift register circuit 122a shown in FIG. 9.

As shown in FIG. 10, the unit shift register circuit 122a has T1 and T3, which are connected to each of the GL (OUT) that drives a scanning line, and T2 and T4, which are connected to the node VC, which is the gate electrode of T1. The gate and drain terminals of T2 are connected, respectively, to the signal VS and the signal S. The gate terminal of T3 is connected CKB, the phase of which is the inverse of CKA. In the second embodiment, T3 operates as a TFT that pulls down the output terminal OUT (scanning line GL) by CKB, the phase of which is the inverse of CKA. In the present embodiment, because CKA and CKB, which has the inverse phase are connected to the gate of the GL pull-down TFT (T3), when not selected (that is, during the time when T1 does not output the output signal OUT), the OUT terminal is pulled down by the CKB signal, so that noise, such as GL floating, is reduced.

Next, referring to FIG. 11, an example of the operation of the unit shift register circuit 122a shown in FIG. 10 will be described. FIG. 11 is a timing diagram describing an example of the operation of the unit shift register circuit 122a of stage n. In the n-stage unit shift register circuit 122a, CKA is CK1 and CKB is CK3, and the output terminal OUT is connected to the scanning line GLn.

Figure 11:
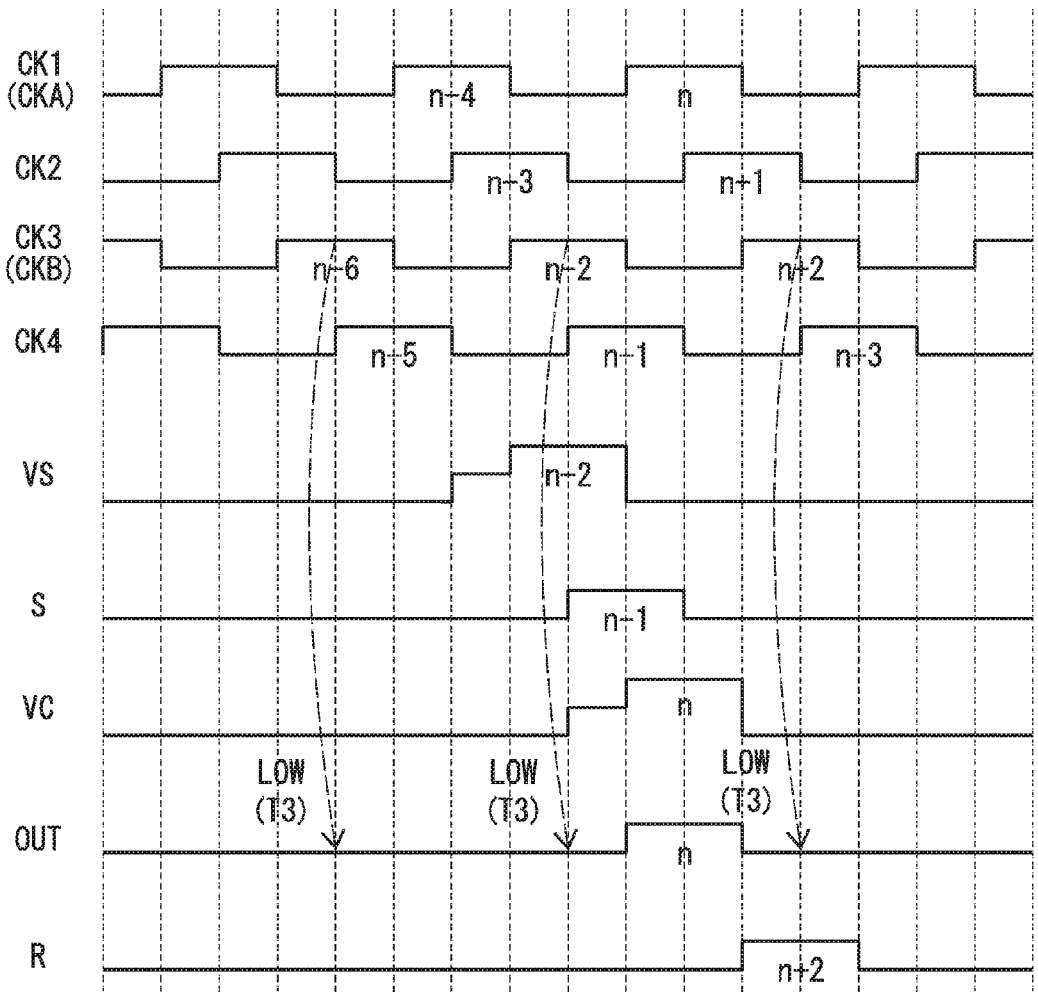
FIG. 11 is an operational timing diagram of the unit shift register circuit 122a (second embodiment) shown in FIG. 10.

As shown in FIG. 11, in the second embodiment, when CK3 changes to the high level, T3 is on and the output terminal OUT goes to the low level (at each of the times n−6, n−2, and n+2). In contrast, when CK1 changes to the high level, the output terminal OUT goes to the high level (that is, currently selected), this operation being the same as in the first embodiment (FIG. 4).

As in the first embodiment, if T3, which is the TFT that pulls down the scanning line GL is reset by the signal R, and pull-down is done only one time during one vertical period (during one vertical scan period). Therefore, if the threshold of transistor T1 is low, leakage current from the clock signal CK (CKA) to the output terminal OUT (GL) might cause the scanning line GL to float upward. In contrast, in the second embodiment, by connecting the clock signal CKB to the gate of T3, noise on the scanning line GL is suppressed.

Third Embodiment

Figure 12:
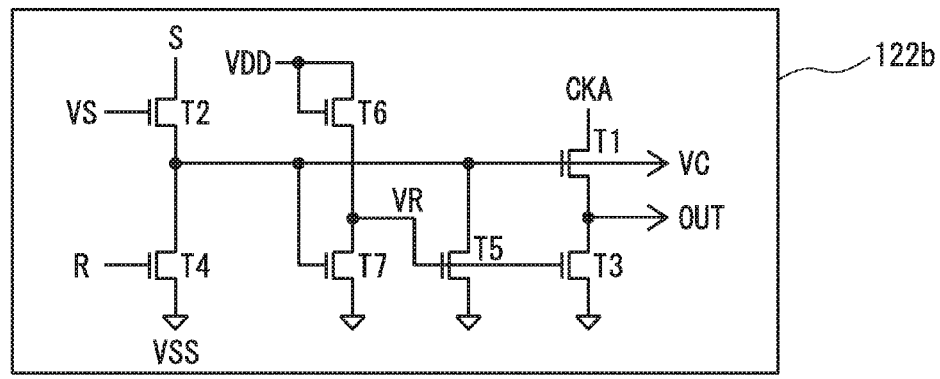
FIG. 12 is a block diagram showing an example of the constitution (third embodiment) of a unit shift register circuit 122b of the present invention.

Next, referring to FIG. 12 and FIG. 13, the third embodiment of the present invention will be described. As shown in FIG. 12, the unit shift register circuit 122b of the third embodiment differs with respect to the unit shift register circuit 122a of the second embodiment shown in FIG. 10 regarding the constitution of the circuit (pull-down circuit) for pulling down the output terminal OUT and the node VC. The constitutions of the shift register circuit and the liquid crystal display device for the case of using a plurality of the unit shift register circuits 122b are the same as in the first embodiment. The clock signal CKA is the same as the clock signal CK in the first embodiment.

As shown in FIG. 12, the pull-down circuit of the unit shift register circuit 122b of the third embodiment is constituted by T3, T5, T6, and T7. The drain and the gate of T6 are connected to the VDD power supply, and the source thereof is connected to the drain of the T7 and the gate of T3 (that is, to node VR). The source of T7 is connected to the VSS power supply and the gate thereof is connected to the node VC. The drain of T5 is connected to the node VC and the source thereof is connected to the VSS power supply. The drain of T3 is connected to the output terminal OUT, and the source thereof is connected to the VSS power supply.

Figure 13:
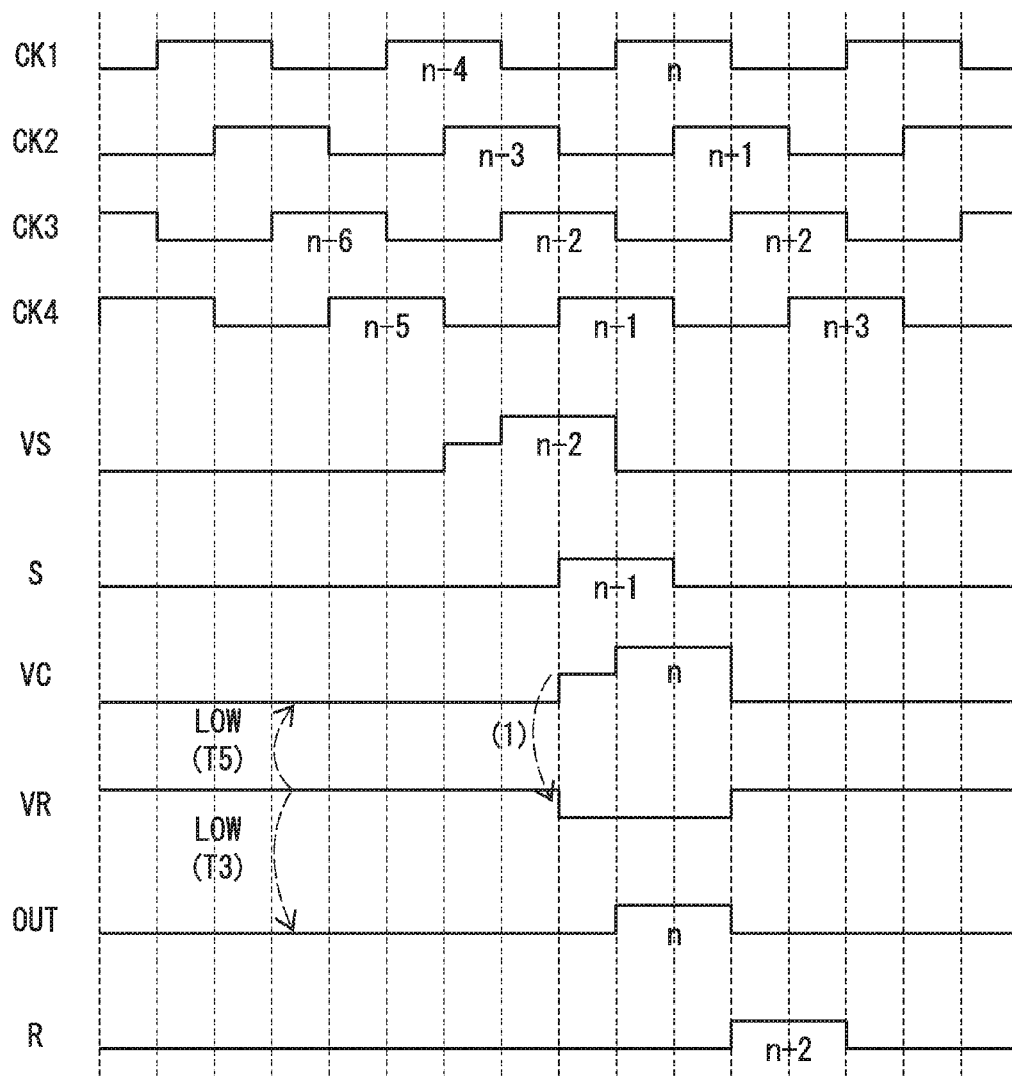
FIG. 13 is an operational timing diagram of the unit shift register circuit 122b (third embodiment) shown in FIG. 12.

As shown in FIG. 13, T6 and T7 constitute a circuit that generates the VR signal, and when T1 (output OUT) is not selected, the node VR is pre-charged via T6 from the VDD potential of power supply to a voltage that is reduced by the amount of the threshold of T6, and the node VC and the output node OUT are constantly pulled down to the VSS level by T3 and T5, to which node VR is connected. When selection is done and the pre-charging operation charges the node VC, T7 turns on and the node VR is pulled down to a level close to VSS (at the time (1) in FIG. 13). The VR potential at that time is determined by the ratio between T6 and T7, and it is possible to make the capacity of T7 larger than that of T6.

In the third embodiment, because pull-down is done in accordance with the node VR DC voltage level, by eliminating the period of time, in the non-selected state, when the node VC and the node G float, noise immunity can be improved. That is, because it is possible by the CKA pulse to completely stop the floating upward of the node VC by coupling, it is possible to suppress clock noise in which CKA noise is output to GL.

In the present embodiment, because it is possible to avoid a voltage drop caused by the threshold voltage of the pre-charge voltage level when performing a setting operation, because it is not necessary to make T7 large in consideration of the gate voltage drop after deterioration, it is possible to make TFT small, and it is possible to reduce the circuit surface area commensurately.

Fourth Embodiment

Figure 14:
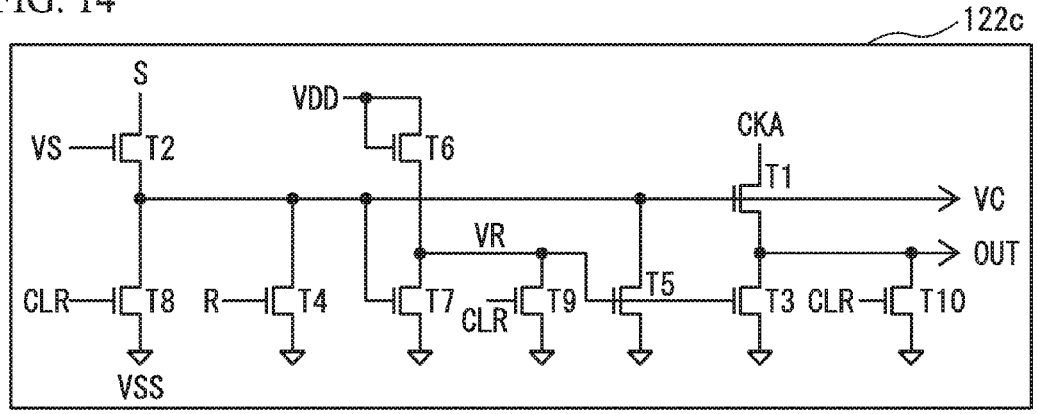
FIG. 14 is a block diagram showing an example of the constitution (fourth embodiment) of a unit shift register circuit 122c of the present invention.

Next, referring to FIG. 14, the fourth embodiment of the present invention will be described. As shown in FIG. 14, the unit shift register circuit 122c of the fourth embodiment differs from the unit shift register circuit 122b of the third embodiment shown in FIG. 12 with respect to the constitution of the circuit (pull-down circuit) for pulling down the output terminal OUT and the node VC. The constitution of the shift register circuit and the liquid crystal display device in the case of using a plurality of the unit shift register circuits 122c are the same as in the first embodiment. The clock signal CKA is the same as the clock signal CK in the first embodiment.

As shown in FIG. 14, the unit shift register circuit 122c of the fourth embodiment, in addition to having the pull-down circuit of the third embodiment, has a CLR signal (clear signal), and T8, T9, and T10, to the gates of which the CLR signal is input, and which are, respectively, connected to the node VC, the node VR, and the node OUT. In this case, the drain of T8 is connected to the node VC, the drain of T9 is connected to the node VR, and the drain of T10 is connected to the node OUT, and all of the sources thereof are connected to the VSS power supply. According to this constitution, the node VC, the node VR, and the output node OUT (GL) can be pulled down by making the CLR signal high. The CLR signal is input from outside the unit shift register circuit 122c.

In the case of constituting a shift register circuit using a plurality of the unit shift register circuits 122c of the fourth embodiment, it is possible to initialize all stages of the shift register circuit at the same time. For example, by clearing at the beginning of the scan period, operation is possible from the initialized state, thereby avoiding unexpected operation or output. By clearing after the end of a scan period, the circuit is initialized and the electrical charge is released. It is thus possible to prevent TFT deterioration caused by charge remaining when operation is stopped.

Fifth Embodiment

Figure 15:
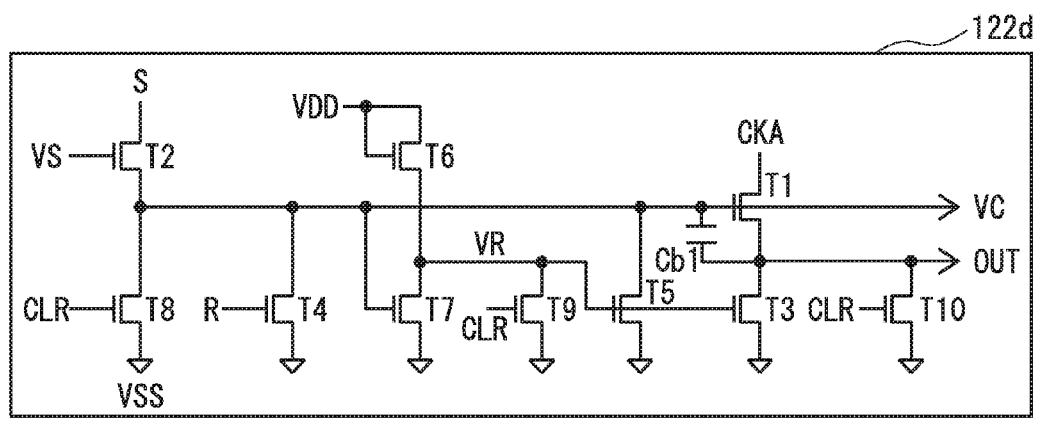
FIG. 15 is a block diagram showing an example of the constitution (fifth embodiment) of a unit shift register circuit 122d of the present invention.

Next, referring to FIG. 15, the fifth embodiment of the present invention will be described. As shown in FIG. 15, the unit shift register circuit 122d of the fifth embodiment differs from the unit shift register circuit 122c of the fourth embodiment shown in FIG. 14 with regard to the provision of a capacitive element Cb1 between the node VC and the node OUT (GL), that is, between the gate electrode and the source terminal of T1. The constitutions of the shift register circuit and the liquid crystal display device for the case of using a plurality of the unit shift register circuits 122d are the same as in the first embodiment. The clock signal CKA is the same as the clock signal CK in the first embodiment.

The capacitance Cb1 acts as a boosting capacitance at the time of bootstrapping operation. Therefore, the boost rate can be increased and the drive capacity improved. This acts to stabilize the potential on the node VC in the non-selected state (that is, to prevent oscillation), and it is possible by the CKA pulse to prevent the floating upward of the node VC by coupling.

Sixth Embodiment

Figure 16:
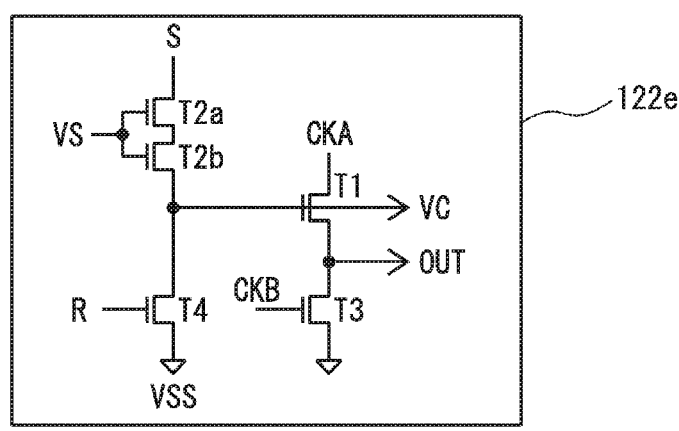
FIG. 16 is a block diagram showing an example of the constitution (sixth embodiment) of a unit shift register circuit 122e of the present invention.

Next, referring to FIG. 16, the sixth embodiment of the present invention will be described. The unit shift register circuit 122e of the sixth embodiment differs from the unit shift register circuit 122a of the second embodiment shown in FIG. 10 regarding the constitution of the setting transistor T2. The constitutions of a shift register circuit and a liquid crystal display device in the case of using a plurality of the unit shift register circuit 122e are the same as in the second embodiment.

A feature of the unit shift register circuit 122e of the sixth embodiment is that a plurality of the setting transistors T2 of the second embodiment are cascode connected in a dual configuration. That is, in the unit shift register circuit 122e of the sixth embodiment, the setting transistors are cascode connected, in which case the gates are mutually connected and the drain of one of the transistors is connected to the source of the other transistor, this being constituted by the plurality of transistors T2a and T2b. The signal VS is input to the gates of T2a and T2b, the signal S is input to the drain of T2a, and the source of T2b is connected to the node VC.

By using dual setting TFTs, it is possible to approximately halve the potential differences between drain and the source VDS of the setting TFTs when the node VC is boosted by the bootstrapping when operating, thereby enabling an improvement of the withstand voltage. Although adopting a dual constitution results in a drop in the drive capacity, because the VS potential during pre-charging operation is very large, sufficient drive capacity is obtained.

Seventh Embodiment

Figure 17:
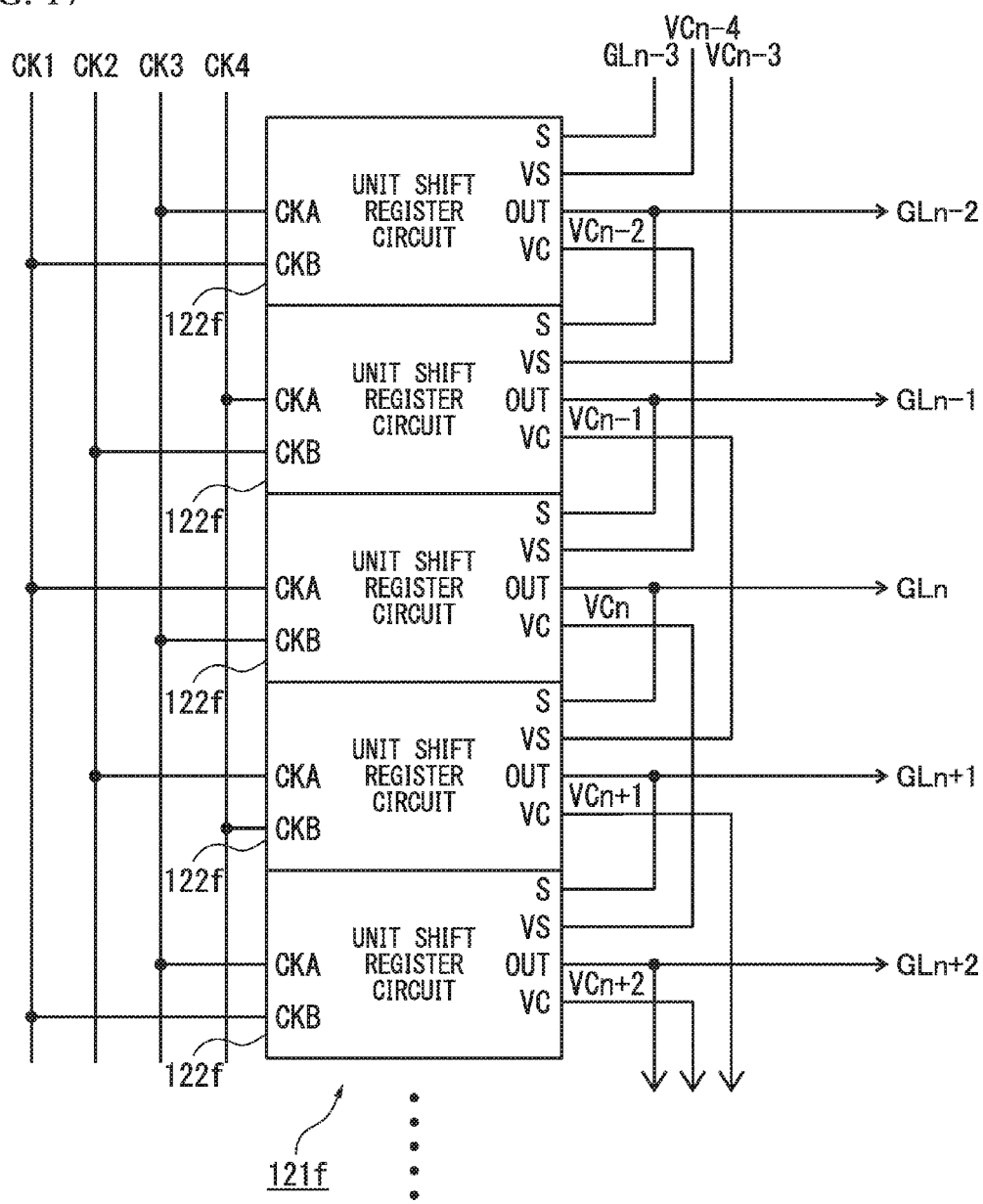
FIG. 17 is a block diagram showing an example of the constitution (seventh embodiment) of a shift register circuit according to the present invention.

Next, referring to FIG. 17 to FIG. 19, the seventh embodiment of the present invention will be described. As shown in FIG. 17, the shift register circuit 121f of the seventh embodiment differs from the shift register circuit 121a of the second embodiment shown in FIG. 9 with regard to omitting the reset terminal R. The interconnection relationships in the liquid crystal display device the shift register circuit 121f are the same as in the second embodiment.

As shown in FIG. 17, the shift register circuit 121f of the seventh embodiment is constituted by a plurality of stages of the cascade-connected unit shift register circuit 122f. The output GLn−1 of the immediately previous stage is input to the S signal of stage N, and the output VCn−2 of the second previous stage is input to the VS signal of the stage N. The clock signals CK constitute a four-phase clock, which is connected in the sequence of CKA=CK1 and CKB=CK3, CKA=CK2 and CKB=CK4, CKA=CK3 and CKB=CK1, and CKA=CK4 and CKB=CK2, in groups of four stages of the shift register.

Each unit shift register circuits 122f is constituted by T1 and T3, which are connected to GL (OUT) which drives a scanning line, T2 and T4, which are connected to the node VC, which is the gate electrode of T1, and T5, which is connected between the node VC and OUT. The signal VS and the signal S are connected, respectively, to the gate terminal and the drain terminal of T2. The gate terminal of T3 is connected to CKB, the phase of which is the inverse of CKA. The gate and drain terminals of T4 are connected, respectively, to CKB and the signal S. The gate terminal of T5 is connected to CKA. Whereas with the circuit constitution of the second embodiment the node VC is pulled down by the resetting TFT T4, in the seventh embodiment, T4 and T5 reset the node VC.

Next, referring to FIG. 19, an example of the operation of the unit shift register circuit 122f shown in FIG. 18 will be described. FIG. 19 is a timing diagram showing an example of the operation of the stage n unit shift register circuit 122f.

In the n-th stage unit shift register circuit 122f, CKA is CK1, CKB is CK3, and the output terminal OUT is connected to the scanning line GLn.

The drain and source of T4 are connected, respectively, to the S terminal and the node VC, and the CKB signal shorts the node VC with the S terminal.

The drain and source of T5 are connected, respectively, to the node VC and the output OUT node, and the CKA signal shorts the node VC with the OUT terminal.

T3 pulls down the OUT terminal by the CKB signal.

The seventh embodiment enables self-resetting. That is, CKB goes high immediately after the selection of output OUT and T4 turns on, so that the node VC is connected to the S terminal, and T3 of the unit shift register circuit 122f of the immediately previous stage, which is connected to the S terminal, and is pulled down (at the time (1) in FIG. 19).

When CKA goes high in the non-selected state, by T5 turning on, the node VC is shorted to the OUT node. Because the OUT node has on it GL, which is a load larger than the node VC, the coupling capacitance between CKA and the node VC is reduced, enabling suppression of noise at the node VC.

When CKA goes low and CKB goes high, T4 turns on, so that the node VC and the S terminal are connected. In this case, because the node VC is connected to GL of the unit shift register circuit 122f of the immediately previous stage, the potential is fixed.

In the seventh embodiment, pull-down is possible with fewer elements than the pull-down circuit of the third embodiment.

Eighth Embodiment

Figure 20:
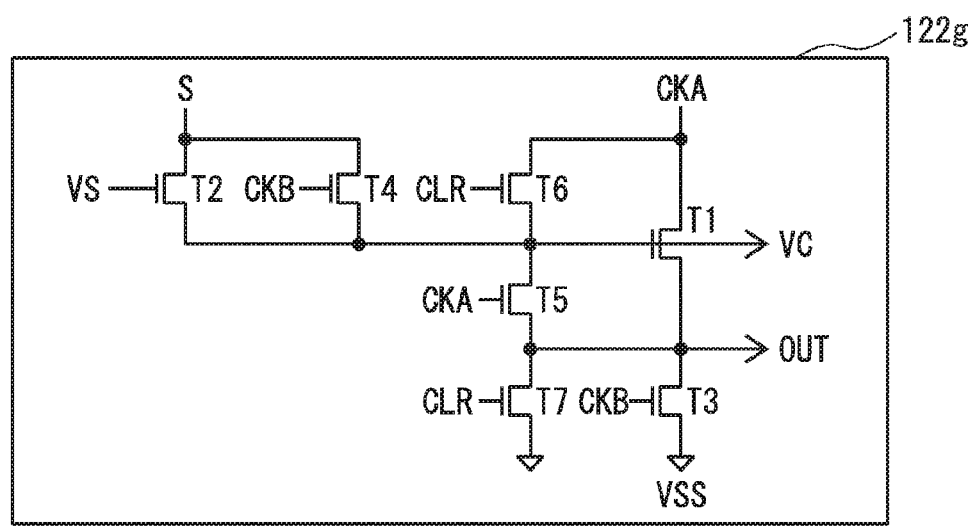
FIG. 20 is a block diagram showing an example of the constitution (eighth embodiment) of a unit shift register circuit 122g of the present invention.

Next, referring to FIG. 20, the eight embodiment of the present invention will be described. As shown in FIG. 20, the unit shift register circuit 122g of the eighth embodiment differs from the unit shift register circuit 122f of the seventh embodiment shown in FIG. 18 regarding the constitution of the pull-down circuit. The constitution of the shift register circuit and the constitution of the liquid crystal display device for the case of using a plurality of the unit shift register circuits 122f are the same as in the seventh embodiment.

Figure 18:
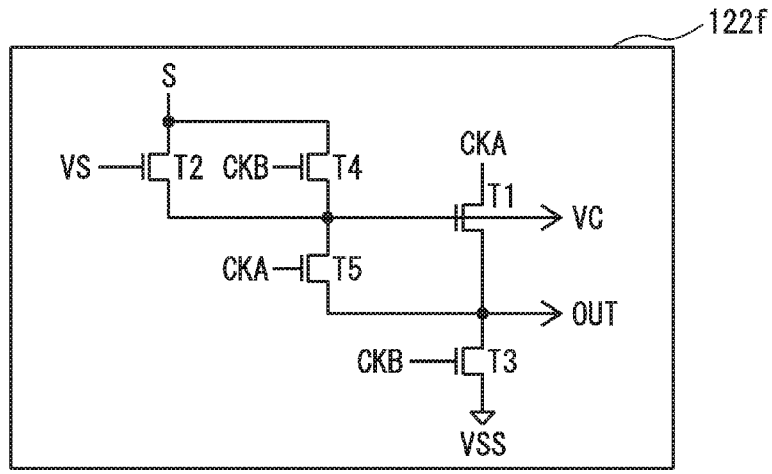
FIG. 18 is a block diagram showing an example of the constitution (seventh embodiment) of a unit shift register circuit 122f shown in FIG. 17.
Figure 19:
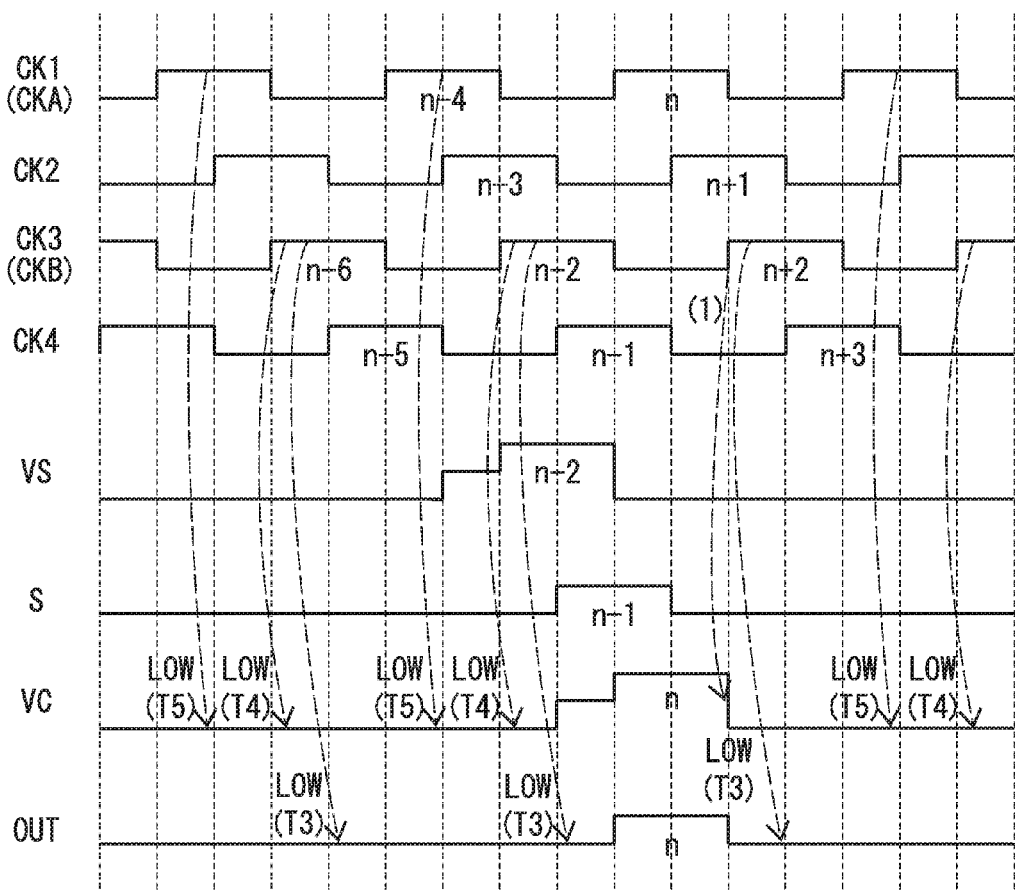
FIG. 19 is an operational timing diagram of the unit shift register circuit 122f shown in FIG. 18.

As shown in FIG. 20, the unit shift register circuit 122g of the eighth embodiment in addition to the constitution of the unit shift register circuit 122f of the seventh embodiment shown in FIG. 18, has a CLR signal, and connects T6 and T7, to the gates of which the CLR signal is input, to the node VC and the node OUT, respectively. In this constitution, the node VC and the output node OUT (GL) can be pulled down by making the CLR signal high.

If a shift register circuit is constituted using a plurality of the unit shift register circuits 122g of the eighth embodiment, all stages of the shift register circuit can be initialized at the same time. For example, by clearing at the start of a scan period, operation is possible from the initialized state, thereby avoiding unexpected operation or output. Also, by clearing at the end of a scanning period, the circuit is initialized and charges are released. It is thus possible to prevent TFT deterioration caused by charge remaining when operation is stopped.

Ninth Embodiment

Next, referring to FIG. 21 to FIG. 23, the ninth embodiment of the present invention will be described. The shift register circuit 121h of the ninth embodiment shown in FIG.

Figure 2:
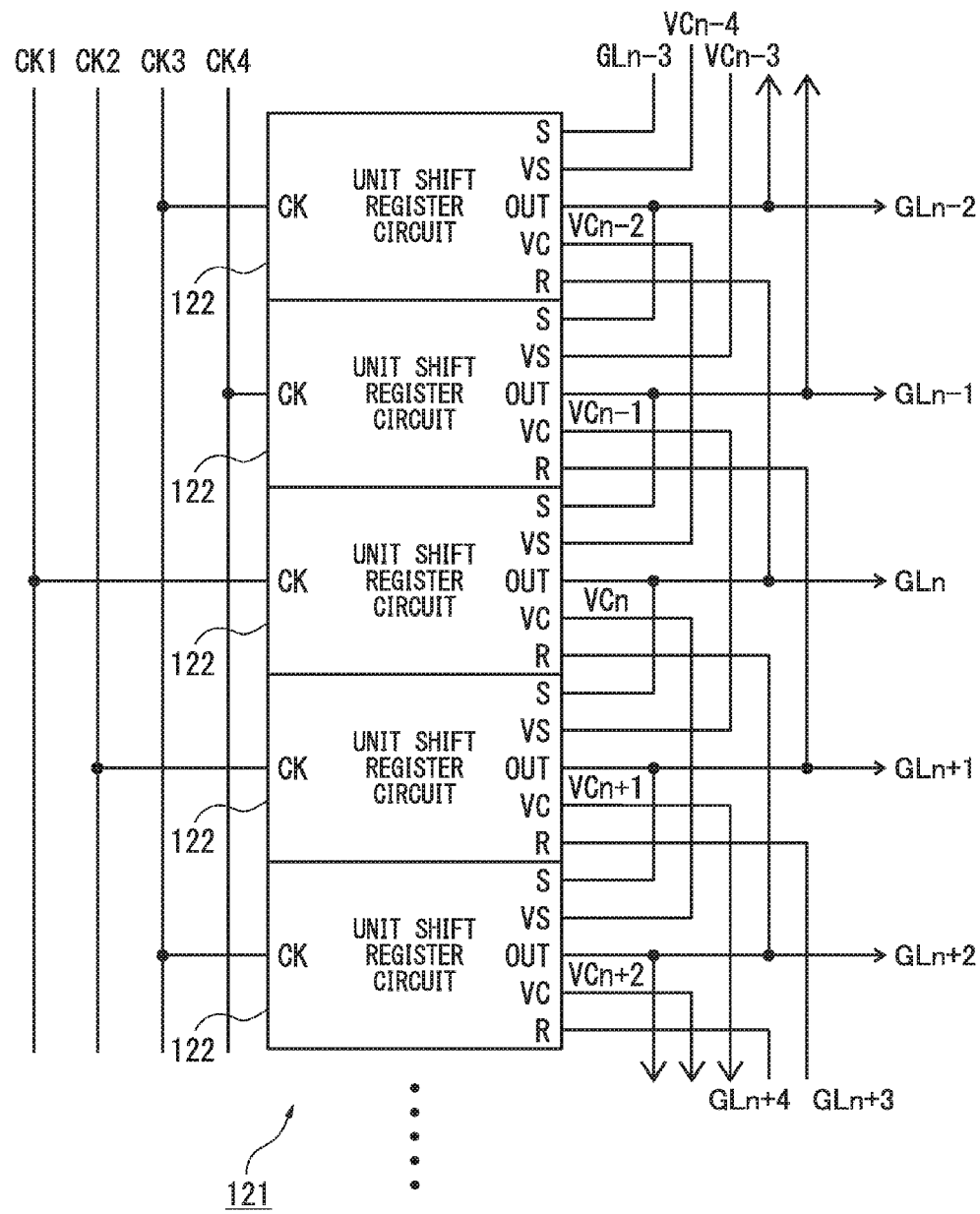
FIG. 2 is a block diagram showing an example of the constitution (first embodiment) of a shift register circuit according to the present invention.

21 has a constitution corresponding to the shift register circuit 121 shown in FIG. 1 within the liquid crystal display device 100 shown in FIG. 1, and the circuitry peripheral to the scanning line GL is the same as the case of the shift register circuit 121.

Figure 21:
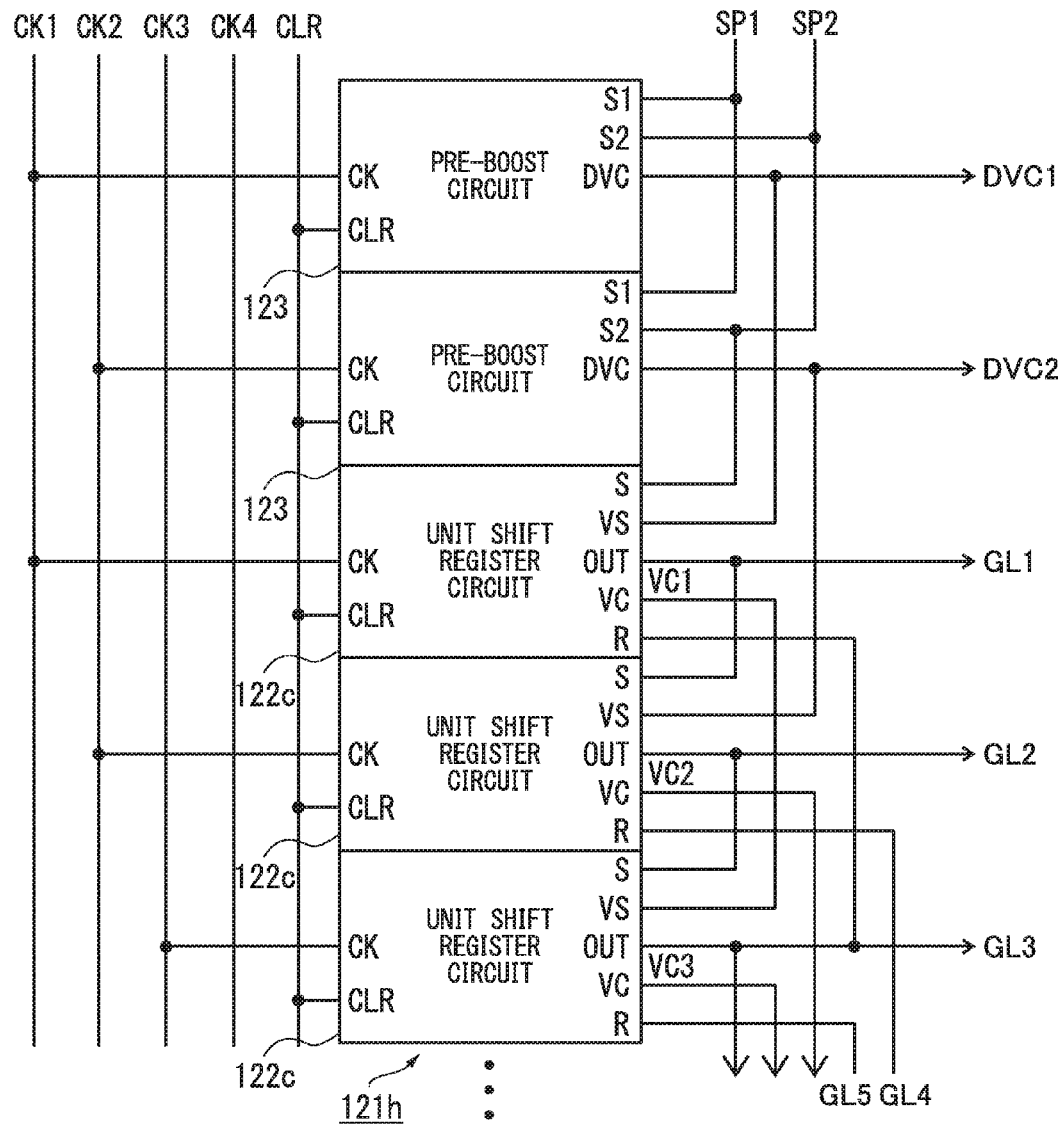
FIG. 21 is a block diagram showing an example of the constitution (ninth embodiment) of a shift register circuit according to the present invention.
Figure 22:
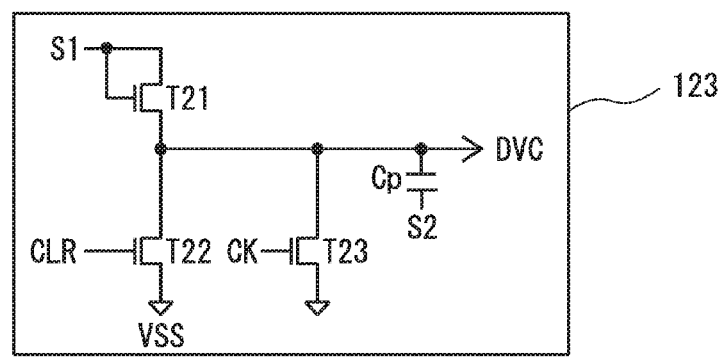
FIG. 22 is a block diagram showing an example of the constitution (ninth embodiment) of a pre-boost circuit 123 shown in FIG. 21.

The shift register circuit 121h shown in FIG. 21 is constituted by a plurality of stages, with two pre-boost circuits 123 and a plurality of unit shift register circuits 122c shown in FIG. 14 cascade connected. In the plurality of unit shift register circuits 122c the output GLn−1 of the immediately previous stage is input to the S signal of stage N, the output VCn−2 of the second previous stage is input to the VS signal of stage N, and the output GLn+2 of the second subsequent stage is input to the R signal of stage N.

The clock signals CK form a four-phase clock, this being connected in the sequence of CK1, CK2, CK3, CK4, in groups of four unit shift register circuits 122c. Each pre-boost circuit 123 is provided with an S1 terminal, and S2 terminal, a DVC terminal, a CK terminal, and a CLR terminal. In the two pre-boost circuits 123, a signal SP1 is input to S1 input and a signal SP2 is input to S2 input. The node DVC (signal DVC1) of the first stage of pre-boost circuit 123 is connected to the VS input of the first stage of unit shift register circuit 122c, and the node DVC (signal DVC2) of the second stage of pre-boost circuit 123 is connected to the VS input of the second stage of unit shift register circuit 122c. That is, the DVC signals boosted by the two stages of pre-boost circuit 123 are sequentially input to the VS terminals of the first two stages of unit shift register circuits 122c. The signal SP2 is connected to the S input of the first stage of the unit shift register circuit 122c. The signals SP1 and SP2, as shown in FIG. 23 are pulse signals generated at the start of operation of the shift register circuit 121h.

The unit shift register circuit 122c is constituted by a circuit that is the same as the four embodiment shown in FIG. 14.

The pre-boost circuit 123 is for generating the VS signal input to the first stage and the second stage of unit shift register circuit 122c. As shown in FIG. 22, in the pre-boost circuit 123, the S1 terminal is diode connected to the drain and the gate of T21, and operation is done so that a value that is the voltage input at S1 reduced by the amount of the threshold voltage of T21 is set from the source to the node DVC. T22 is an initialing TFT, the CLR signal being connected to the gate, the drain being connected to the node DVC, and the source being connected to the VSS power supply. When the CLR signal is high, the DVC node is reset to the VSS level. CK is input to the gate of T23, the drain of which is connected to the node DVC, and the source of which is connected to the VSS power supply. When the CK signal is high, the node DVC is reset to the VSS level. The capacitor Cp is a capacitive element for raising the voltage of the node DVC. One end of the capacitor Cp is connected to the node DVC, and the other end is connected to the terminal SP2.

Figure 23:
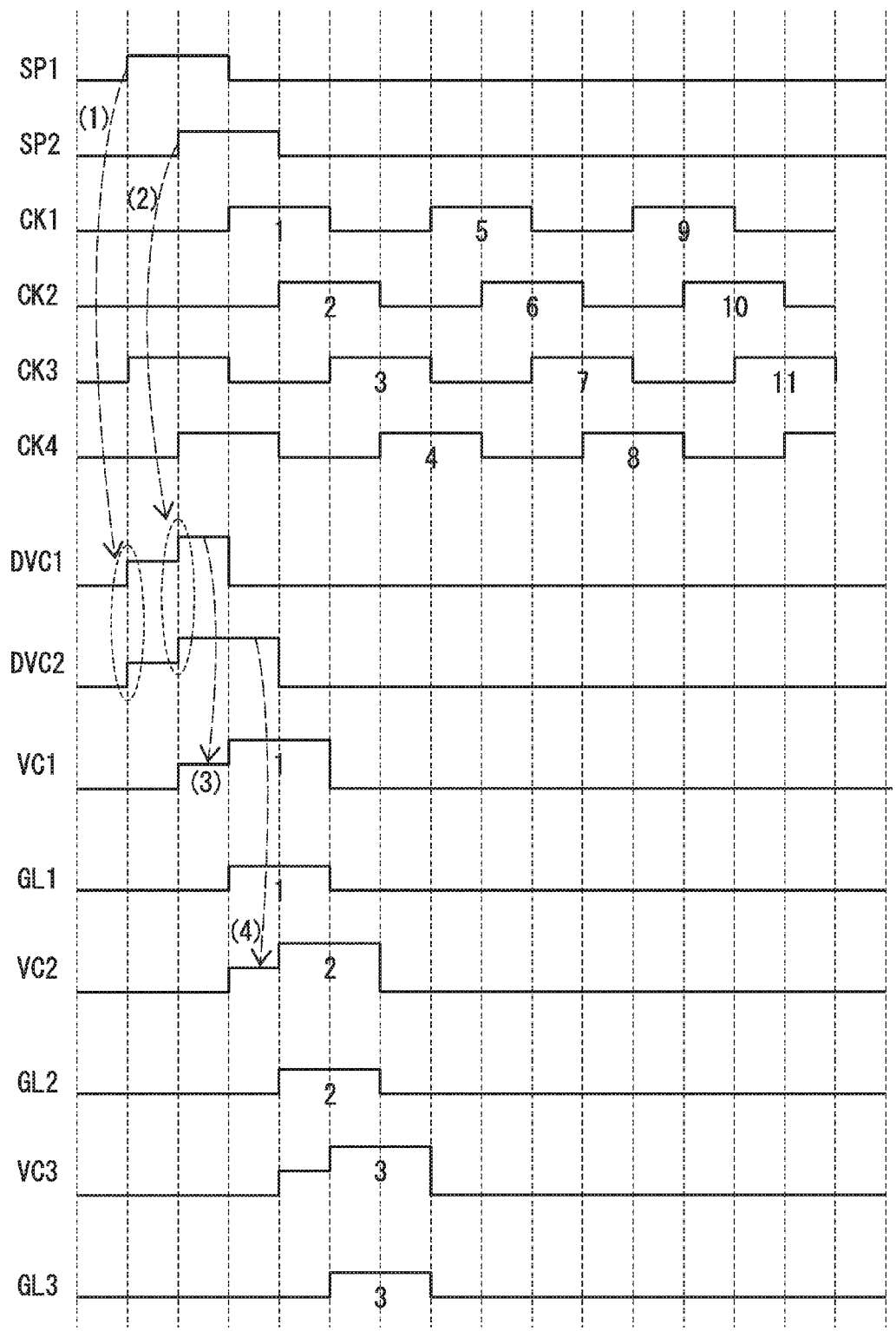
FIG. 23 is an operational timing diagram of the shift register circuit 121h (ninth embodiment) shown in FIG. 21.

Next, referring to FIG. 23, an example of the operation in the case in which, in the shift register circuit 121h shown in FIG. 21, the signals SP1 and SP2 perform generation of the boost signal for initialization.

At time (1) in FIG. 23, when the signal SP1 rises, DVC1 and DVC2 of the two pre-boost circuits 123 are pre-charged.

At time (2) in FIG. 23, when the signal SP2 rises, because there is a connection to the voltage boosting capacitor Cp of the pre-boost circuit 123, DVC1 and DVC2 are boosted by the amount of the amplitude of SP2.

At time (3) in FIG. 23, SP2 is connected to the S terminal and DVC1 is connected to the VS terminal of the first stage of unit shift register circuit 122c for driving the scanning line GL1, and because DVC1 is boosted to a high voltage by the boosting operation at time (2), the node VC1 is pre-charged to the potential of SP2 which is connected to the S terminal.

At time (4) in FIG. 23, GL1 is connected to the S terminal and DVC2 is connected to the VS terminal of the second stage of unit shift register circuit 122c for driving the scanning line GL2, and because DVC2 is boosted to a high voltage by the boosting operation at time (2), the node VC2 is pre-charged to the potential of GL1 which is connected to the S terminal.

After the above, the scanning lines GL rise sequentially.

According to the ninth embodiment, because the pre-boost circuit 123 enables pre-charging from the first-stage setting signal, without the influence of the threshold, a sufficient operating margin is obtained.

Tenth Embodiment

A feature of the tenth embodiment is the materials used in the TFT semiconductor layers in the above-described unit shift register circuits 121a to 121g and within the pre-boost circuit 123. That is, an oxide semiconductor can be included in the semiconductor layer of the TFTs used in each of the above-noted embodiments.

In this case, the oxide semiconductor layer is, for example, an In—Ga—Zn—O based semiconductor layer. The oxide semiconductor layer includes, for example, In—Ga—Zn—O based semiconductor. In this case, the In—Ga—Zn—O based semiconductor is a three-element oxide of In (indium), Ga (gallium), and Zn (zinc), and the composition proportions of In, Ga, and Zn are not particularly restricted. They can be, for example, In:Ga:Zn=2:2:1, In:Ga:Zn=1:1:1, or In:Ga:Zn=1:1:2. In the present embodiment, for example, an In—Ga—Zn—O based semiconductor film that contains In, Ga, and Zn in the proportions 1:1:1 is used.

Figure 24:
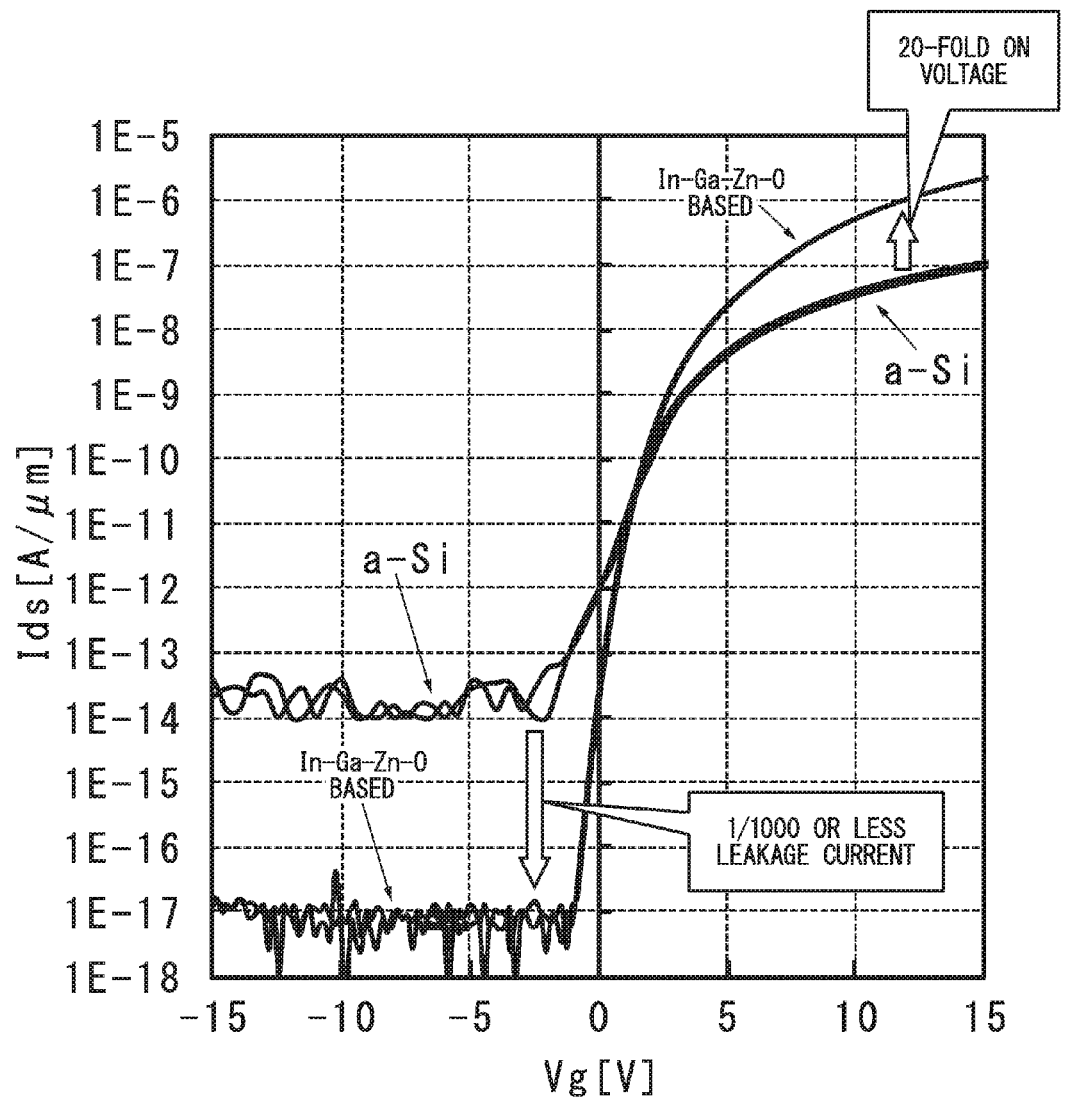
FIG. 24 is a characteristics drawing (describing the tenth embodiment) showing one example of the characteristics of a TFT that includes an oxide semiconductor in a semiconductor layer.

Because a TFT having an In—Ga—Zn—O semiconductor layer has a high mobility (for example more than 20 times that of an a-Si TFT) and a low leakage current (less and 1/1000 of that of an a-Si TFT), this is preferably used as drive TFTs and pixel TFTs. If a TFT having an In—Ga—Zn—O based semiconductor layer is used, the power consumption of the display device can be greatly reduced (refer to FIG. 24). FIG. 24 shows the characteristics of correspondence between the gate voltage and the drain-source current.

The In—Ga—Zn—O based semiconductor may be amorphous, may include a crystalline part, and may be crystalline. A preferable crystalline In—Ga—Zn—O based semiconductor is one having a c axis that is oriented to be substantially perpendicular with respect to the layer surface. A crystalline structure such an In—Ga—Zn—O based semiconductor is disclosed, for example, in Japanese Patent Application Publication No. 2012-124475, the entire content of the disclosure of which is incorporated in the present specification as a reference.

Instead of an In—Ga—Zn—O based semiconductor, the oxide semiconductor layer may include another oxide semiconductor layer. For example, it may include a Zn—O based semiconductor (ZnO), an In—Zn—O based semiconductor (IZO (registered trademark)), a Zn—Ti—O based semiconductor (ZTO), a Cd—Ge—O based semiconductor, a Cd—Pb—O based semiconductor, CdO (cadmium oxide), an Mg—Zn—O based semiconductor, an In—Sn—Zn—O based semiconductor (for example, In2O3-SnO2, ZnO), or an In—Ga—Sn—O based semiconductor.

As described above, according to the embodiments of the present invention, by inputting to the source terminal (second source terminal) and the gate terminal (second gate electrode) of the setting transistor T2, an S input (first input signal) and a VS input (second input signal, where the voltage of the second input signal is greater than that of the first input signal), it is possible to charge (that is, pre-charge) the gate terminal (first gate electrode) of the output transistor T1. In this case, it is easy to omit the diode-connected TFT and the second bootstrapping capacitor. Because, for example, the gate (first gate electrode) signal of the output transistor T1 of another unit shift register circuit can be used as the VS input (second input signal), it is easy to provide this. Thus, the unit shift register circuit of the present invention can easily reduce the influence of characteristics deterioration with a small number of circuit elements.

Embodiments of the present invention are not restricted to those noted above. For example, as appropriate, the constitutions of the above-noted embodiments may be combined, and the constitution may be changed to omit a part thereof in an above-noted embodiments.

INDUSTRIAL APPLICABILITY

The present invention can be used as a unit shift register circuit or the like capable of reducing the influence of characteristics deterioration with a small number of circuit elements.

DESCRIPTION OF REFERENCE NUMERALS

100 Liquid crystal display device
110 Display area
120 Scanning line drive circuit
121, 121a, 121f, 121h Shift register circuit
130 Signal line drive circuit
PIX Pixel
GL1 to GLn Scanning line
122, 122a to 122g Unit shift register circuit
T1 to T10 TFT
Cb1 Capacitive element

The invention claimed is:

1. A unit shift register circuit that includes each stage of a shift register circuit, the unit shift register circuit comprising:
    a first transistor that is an output transistor that includes a first gate electrode, a first source terminal, and a first drain terminal, the first transistor inputting a first clock signal to the first drain terminal and outputting an output signal from the first source terminal;
    a second transistor that is a setting transistor that includes a second gate electrode, a second source terminal, and a second drain terminal, the second transistor inputting a first input signal to the second drain terminal and inputting to the second gate electrode a second input signal in a case of charging the first gate electrode of the first transistor, the second input signal having a voltage higher than that of the first input signal;
    a third transistor that includes a third gate electrode, a third source terminal, and a third drain terminal, the third source terminal being electrically connected to the first gate electrode of the first transistor, and the third drain terminal being electrically connected to the second drain terminal of the second transistor;
    a fourth transistor that includes a fourth gate electrode, a fourth source terminal, and a fourth drain terminal, the fourth drain terminal being electrically connected to the first source terminal of the first transistor, the fourth source terminal being electrically connected to a power supply, and a second clock signal being input to the fourth gate electrode; and
    a fifth transistor that includes a fifth gate electrode, a fifth source terminal, and a fifth drain terminal, the fifth drain terminal being electrically connected to the second source terminal of the second transistor, the fifth source terminal being electrically connected to the first source terminal of the first transistor, and the first clock signal being input to the fifth gate electrode, wherein
    the first gate electrode of the first transistor and the second drain terminal of the second transistor electrically conduct with each other in response to the third transistor inputting, to the third gate electrode, the second clock signal having a phase that is inverted with respect to a phase of the first clock signal; and
    the first transistor, the second transistor, the third transistor, the fourth transistor, the fifth transistor are the only transistors in the unit shift register circuit.

2. The unit shift register circuit according to claim 1, wherein, in a case that the second transistor charges the first gate electrode of the first transistor, the first input signal and the second input signal rise and, after charging of the first gate electrode, the second input signal voltage falls earlier than the fall of the first input signal voltage.

3. The unit shift register circuit according to claim 1, wherein the first transistor boosts the output signal by a bootstrapping operation that boosts the first gate voltage by a voltage charged in a parasitic capacitance between the first source terminal and the first gate electrode.

4. The unit shift register circuit according to claim 1, wherein the first input signal is an output signal of the unit shift register circuit of another stage, and the second input signal is a signal of the first gate electrode of an output transistor of the unit shift register circuit of another stage.

5. The unit shift register circuit according to claim 1, wherein the third transistor resets the first gate electrode of the first transistor in response to the second clock signal.

6. The unit shift register circuit according to claim 1, wherein the fourth transistor pulls down an output signal of the unit shift register circuit in response to the second clock signal.

7. The unit shift register circuit according to claim 1, wherein the unit shift register circuit includes a capacitive element that is electrically connected between the first gate electrode and the first source terminal of the first transistor.

8. The unit shift register circuit according to claim 1, wherein the second transistor includes a plurality of cascode-connected transistors.

9. The unit shift register circuit according to claim 1, wherein at least the first transistor and the second transistor include an oxide semiconductor in a semiconductor layer.

10. The unit shift register circuit according to claim 9, wherein the oxide semiconductor is an oxide indium gallium zinc (an oxide semiconductor including an In—Ga—Zn—O based semiconductor, an oxide semiconductor containing indium (In), gallium (Ga), zinc (Zn), and oxygen (O)).

11. The unit shift register circuit according to claim 10, wherein the oxide semiconductor has crystallinity.

12. A shift register circuit that is in a multistage connection of unit shift register circuits including the unit shift register circuit according to claim 1,
wherein an output signal of an N–1 stage unit shift register circuit is the first input signal of an N-stage unit shift register circuit, and
the first gate electrode signal of an output transistor of an N–2 stage unit shift register circuit is the second input signal of the N-stage unit shift register circuit.

13. The shift register circuit according to claim 12,
wherein clock signals that include the first dock signal, the second dock signal, a third dock signal, and a fourth dock signal, and that are of a four-phase clock are input as clock signals to the unit shift register circuits sequentially, shifted by one-fourth period each.

14. The unit shift register circuit according to claim 1, wherein:
the fifth drain terminal is connected to the first gate electrode of the first transistor, and the fourth fifth source terminal is connected to the first source terminal of the first transistor, and
wherein the first gate electrode of the first transistor and the first source terminal of the first transistor electrically short each other in response to the fifth transistor inputting, to the fifth gate electrode, the first clock signal.

15. A method for controlling a unit shift register circuit that includes each stage of a shift register circuit,
wherein the unit shift register circuit includes:
a first transistor that is an output transistor that includes a first gate electrode, a first source terminal, and a first drain terminal, the first transistor inputting a first clock signal to the first drain terminal and outputting an output signal from the first source terminal;
a second transistor that is a setting transistor that includes a second gate electrode, a second source terminal, and a second drain terminal, the second transistor inputting a first input signal to the second drain terminal and inputting to the second gate electrode a second input signal differing from the first input signal;
a third transistor that includes a third gate electrode, a third source terminal, and a third drain terminal, the third source terminal being electrically connected to the first gate electrode of the first transistor, and the third drain terminal being electrically connected to the second drain terminal of the setting second transistor;
a fourth transistor that includes a fourth gate electrode, a fourth source terminal, and a fourth drain terminal, the fourth drain terminal being electrically connected to the first source terminal of the first transistor, the fourth source terminal being electrically connected to a power supply, and a second clock signal being input to the fourth gate electrode; and
a fifth transistor that includes a fifth gate electrode, a fifth source terminal, and a fifth drain terminal, the fifth drain terminal being electrically connected to the second source terminal of the second transistor, the fifth source terminal being electrically connected to the first source terminal of the first transistor, and the first clock signal being input to the fifth gate electrode, wherein
the first gate electrode of the first transistor and the second drain terminal of the second transistor electrically conduct with each other in response to the third transistor inputting, to the third gate electrode, the second clock signal having a phase that is inverted with respect to a phase of the first clock signal; and
the first transistor, the second transistor, the third transistor, the fourth transistor, the fifth transistor are the only transistors in the unit shift register circuit;
the method including:
fixing a potential of the first gate electrode of the first transistor to a potential of the first input signal by electrically conducting the first gate electrode of the first transistor and the second drain terminal of the second transistor with each other according to the second clock signal after the output signal is selected.

16. The method according to claim 15, wherein:
the shift register circuit is included in a multistage connection of unit shift register circuits,
the method further includes fixing a potential of the first gate electrode of the first transistor to a potential of the first input signal by electrically conducting the first gate electrode of the first transistor and the second drain terminal of the second transistor with each other according to the second clock signal after the output signal is selected, and
the fixing of the potential of the first gate electrode is performed by setting an output signal of an N–1 stage unit shift register circuit to be the first input signal of an N-stage unit shift register circuit, and by setting the first gate electrode signal of an output transistor of an N–2 stage unit shift register circuit to be the second input signal of the N-stage unit shift register circuit.

17. A display device comprising:
a plurality of pixels;
a plurality of scanning lines to which the plurality of pixels are electrically connected; and
a unit shift register circuit that includes each stage of a shift register circuit,
wherein the unit shift register circuit includes:
a first transistor that is an output transistor that includes a first gate electrode, a first source terminal, and a first drain terminal, the first transistor inputting a first clock signal to the first drain terminal and outputting an output signal driving each of the scanning lines from the first source terminal;
a second transistor that is a setting transistor that includes a second gate electrode, a second source terminal and a second drain terminal, the second transistor inputting a first input signal to the second drain terminal and inputting to the second gate electrode a second input signal in a case of charging the first gate electrode of the first transistor, the second input signal having a voltage higher than that of the first input signal;
a third transistor that includes a third gate electrode, a third source terminal, and a third drain terminal, the third source terminal being electrically connected to the first gate electrode of the first transistor, and the third drain terminal being electrically connected to the second drain terminal of the second transistor;
a fourth transistor that includes a fourth gate electrode, a fourth source terminal, and a fourth drain terminal, the fourth drain terminal being electrically connected to the first source terminal of the first transistor, the fourth source terminal being electrically connected to a power supply, and a second clock signal being input to the fourth gate electrode; and
a fifth transistor that includes a fifth gate electrode, a fifth source terminal, and a fifth drain terminal, the fifth drain terminal being electrically connected to the second source terminal of the second transistor, the fifth source terminal being electrically connected to the first source terminal of the first transistor, and the first clock signal being input to the fifth rate electrode, wherein the first gate electrode of the first transistor and the second drain terminal of the second transistor electrically conduct with each other in response to the third transistor inputting, to the third gate electrode, the second clock signal having a phase that is inverted with respect to a phase of the first clock signal; and the first transistor, the second transistor, the third transistor, the fourth transistor, the fifth transistor are the only transistors in the unit shift register circuit.

* * * * *